(12) United States Patent
Lee et al.

(10) Patent No.: US 11,569,318 B2
(45) Date of Patent: Jan. 31, 2023

(54) DISPLAY DEVICE WITH BOTTOM CONDUCTIVE PATTERN AND METHOD OF MANUFACTURING THE SAME

(71) Applicant: Samsung Display Co., Ltd., Yongin-si (KR)

(72) Inventors: Kangyoung Lee, Yongin-si (KR); Yongseok Kim, Yongin-si (KR); Dongchul Shin, Yongin-si (KR); Hyunsup Lee, Yongin-si (KR); Gyehwan Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 277 days.

(21) Appl. No.: 16/851,922

(22) Filed: Apr. 17, 2020

(65) Prior Publication Data

US 2021/0118968 A1    Apr. 22, 2021

(30) Foreign Application Priority Data

Oct. 22, 2019   (KR) .................. 10-2019-0131393

(51) Int. Cl.
*H01L 27/32* (2006.01)
*H01L 51/56* (2006.01)

(52) U.S. Cl.
CPC ...... *H01L 27/3248* (2013.01); *H01L 27/3276* (2013.01); *H01L 51/56* (2013.01)

(58) Field of Classification Search
CPC .. H01L 27/3248; H01L 27/3276; H01L 51/56
See application file for complete search history.

(56) References Cited

U.S. PATENT DOCUMENTS

| 8,044,426 | B2* | 10/2011 | Hwang | H01L 27/3276 257/E33.065 |
| 8,338,958 | B2* | 12/2012 | Nishio | H01L 25/50 257/E21.597 |
| 2001/0005043 | A1* | 6/2001 | Nakanishi | H01L 23/481 257/E23.011 |
| 2003/0024635 | A1* | 2/2003 | Utsunomiya | H01L 21/2007 156/155 |

(Continued)

FOREIGN PATENT DOCUMENTS

| KR | 10-2016-0001186 | 1/2016 |
| KR | 10-1686096 | 12/2016 |

(Continued)

*Primary Examiner* — Lex H Malsawma
(74) *Attorney, Agent, or Firm* — Kile Park Reed & Houtteman PLLC

(57) ABSTRACT

A display device includes a substrate having a top surface, a bottom surface, and a first contact hole passing through the top surface and the bottom surface; a thin film transistor disposed above the top surface and including a semiconductor layer; a display element connected to the thin film transistor; a top conductive pattern disposed between the substrate and the thin film transistor and overlapping the semiconductor layer of the thin film transistor; a bottom conductive pattern disposed on the bottom surface and connected to the top conductive pattern through the first contact hole; and a bottom planarization layer disposed on the bottom surface, the bottom planarization layer disposed on the bottom conductive pattern.

19 Claims, 19 Drawing Sheets

(56) References Cited

U.S. PATENT DOCUMENTS

| | | | | |
|---|---|---|---|---|
| 2006/0205161 A1* | 9/2006 | Das | ............... | H01L 29/66462 |
| | | | | 257/E29.127 |
| 2010/0093169 A1* | 4/2010 | Kuo | ............... | H01L 21/76898 |
| | | | | 438/667 |
| 2012/0091594 A1* | 4/2012 | Landesberger | ......... | H01L 24/19 |
| | | | | 257/E23.068 |
| 2017/0154850 A1* | 6/2017 | Kao | ............... | H01L 21/6835 |
| 2017/0170251 A1* | 6/2017 | Moon | ............... | H01L 29/41733 |
| 2018/0012549 A1* | 1/2018 | Lee | ............... | H01L 27/323 |
| 2018/0097047 A1* | 4/2018 | Jung | ............... | H01L 27/3258 |
| 2018/0144684 A1 | 5/2018 | Jeon et al. | | |
| 2019/0027096 A1* | 1/2019 | Kim | ............... | H01L 27/124 |
| 2019/0393274 A1 | 12/2019 | Park et al. | | |

FOREIGN PATENT DOCUMENTS

| | | |
|---|---|---|
| KR | 10-2017-0074622 | 6/2017 |
| KR | 10-2018-0015326 | 2/2018 |
| KR | 10-2018-0056442 | 5/2018 |
| KR | 10-2019-0077779 | 7/2019 |

\* cited by examiner

DISPLAY DEVICE WITH BOTTOM CONDUCTIVE PATTERN AND METHOD OF MANUFACTURING THE SAME

CROSS-REFERENCE TO RELATED APPLICATION

This application claims priority to and benefits of Korean Patent Application No. 10-2019-0131393 under 35 U.S.C. § 119, filed in the Korean Intellectual Property Office on Oct. 22, 2019, the entire contents of which are incorporated herein by reference.

BACKGROUND

1. Technical Field

One or more embodiments relate to a display device including a wiring below a substrate and a method of manufacturing the display device.

2. Description of the Related Art

As the information-oriented society is developing, the demand for display devices for displaying different images in various ways has increased. Display devices have rapidly changed from cathode ray tubes (CRT) having a large volume to slim and lightweight flat panel display devices (FPD) having a large display area. Flat panel display devices include liquid crystal display devices (LCD), plasma display panels (PDP), organic light-emitting display devices (OLED), and electrophoretic display devices (EPD).

A display device may include a substrate including a display area and a non-display area, and various wirings that transfer electric signals to the display area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a display device including a conductive pattern on a bottom surface of a substrate, and a method of manufacturing a display device.

Additional aspects will be set forth in part in the description which follows and, in part, will be apparent from the description, or may be learned by practice of the embodiments of the disclosure.

According to one or more embodiments, a display device may include a substrate having a top surface, a bottom surface, and a first contact hole passing through the top surface and the bottom surface. The display device may include a thin film transistor disposed above the top surface and including a semiconductor layer, a display element connected to the thin film transistor, a top conductive pattern disposed between the substrate and the thin film transistor and overlapping the semiconductor layer of the thin film transistor, a bottom conductive pattern disposed on the bottom surface and connected to the top conductive pattern through the first contact hole, and a bottom planarization layer disposed on the bottom conductive pattern over the bottom surface.

The display device may include a buffer layer disposed above the top conductive pattern and including a second hole. The semiconductor layer may be connected to the top conductive pattern through the second contact hole.

The first contact hole may be disposed apart from the second contact hole in a second direction intersecting a first direction perpendicular to the top surface.

The display device may further include a bottom buffer layer between the substrate and the bottom conductive pattern.

The display device may further include a connection electrode between the thin film transistor and the display element, wherein the thin film transistor may be connected to the display element through the connection electrode.

The substrate may include base layers including a polymer resin, and barrier layers including an inorganic material, wherein the base layers and the barrier layers may be alternately stacked.

The semiconductor layer may include a step difference.

The thin film transistor may include a gate electrode disposed above the semiconductor layer, and the gate electrode may be connected to a first bottom electrode through a third contact hole in the substrate, the first bottom electrode being disposed between the substrate and the bottom planarization layer.

The display device may further include a bottom insulating layer under the bottom planarization layer, and a second bottom electrode between the bottom planarization layer and the bottom insulating layer, the second bottom electrode corresponding to the first bottom electrode.

The top conductive pattern may include a first layer including a metal, and a second layer including a metal different from the metal of the first layer.

The first layer and a pixel electrode of the display element may include a same metal.

The thin film transistor may include a source electrode and a drain electrode each connected to the semiconductor layer disposed on the top surface, and at least one of the source electrode and the drain electrode may be connected to the top conductive pattern through a fourth contact hole.

According to one or more embodiments, a display device may include a substrate including a top surface, a bottom surface, and a first contact hole passing through the top surface and the bottom surface. The display device may include a thin film transistor including a semiconductor layer, a source electrode, and a drain electrode each disposed above the top surface, a display element connected to the thin film transistor and disposed above the top surface, a bottom conductive pattern disposed on the bottom surface and connected to at least one of the source electrode and the drain electrode through the first contact hole, and a bottom planarization layer disposed on the bottom conductive pattern.

The display device may further include a conductive pattern corresponding to the first contact hole and contacting at least one of the source electrode and the drain electrode, wherein the bottom conductive pattern may be connected to the conductive pattern through the first contact hole.

According to one or more embodiments, a method of manufacturing a display device may include forming a display layer on a top surface of a substrate disposed on a first carrier substrate, the display layer including a display element, detaching the first carrier substrate from a bottom surface of the substrate, attaching a second carrier substrate such that the second carrier substrate faces the top surface of the substrate, forming a first contact hole in the substrate, and forming a bottom conductive pattern on the bottom surface, the bottom conductive pattern corresponding to the first contact hole.

The forming of the display layer may include forming a top conductive pattern corresponding to a portion of the substrate in which the first contact hole may be formed. The method may include connecting the bottom conductive pattern to the top conductive pattern through the first contact hole.

The forming of the top conductive pattern may include forming a first layer including a metal, and forming a second layer including a metal different from the metal of the first layer.

The forming of the display layer may include forming a buffer layer on the top conductive pattern, and forming a thin film transistor including a semiconductor layer disposed on the buffer layer, the semiconductor layer overlapping the top conductive pattern, wherein the method may include connecting the top conductive pattern to the semiconductor layer through a second contact hole of the buffer layer.

The method may further include, before the forming of the first contact hole, forming a bottom buffer layer on the bottom surface of the substrate.

The method may further include forming a bottom planarization layer disposed on the bottom conductive pattern.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
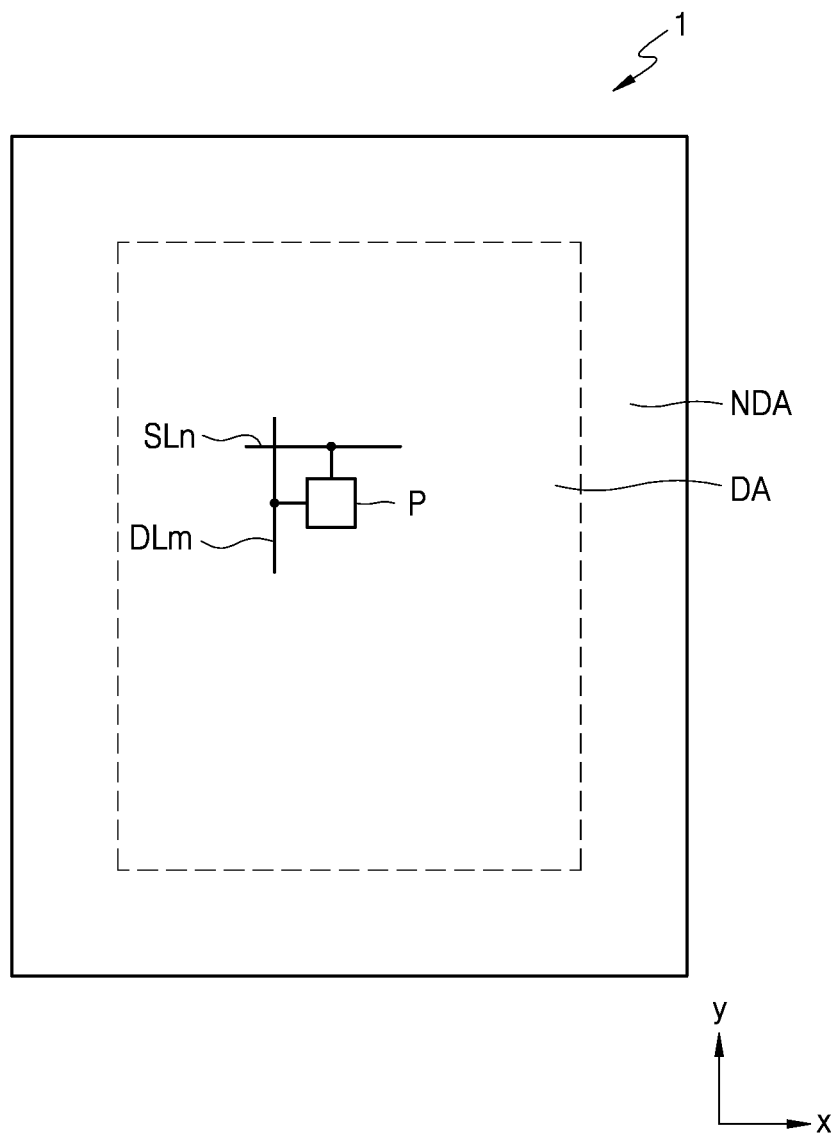
FIG. 1 is a schematic plan view of a display device according to an embodiment.

Reference will now be made in detail to embodiments, examples of which are illustrated in the accompanying drawings, wherein like reference numerals refer to like elements throughout. Repeated descriptions may be omitted. In this regard, embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof. For example, references to at least one of a source electrode and a drain electrode indicate only the source electrode, only the drain electrode, both the source electrode and the drain electrode, or variations thereof.

It will be understood that although the terms "first," "second," etc. may be used herein to describe various components, these components should not be limited by these terms. Such terms are only used to distinguish one component from another.

As used herein, the singular forms "a," "an," and "the" are intended to include the plural forms as well, unless the context clearly indicates otherwise.

It will be further understood that terms such as "comprises," "comprising," "has," "having", and/or "including" specify the presence of stated features or components, but do not preclude the presence or addition of one or more other features or components.

It will be understood that when a layer, region, or component is referred to as being "on" or "formed on," another layer, region, or component, it can be directly or indirectly on or formed on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation. Embodiments are not limited thereto.

Embodiments may be implemented differently. For example, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with another layer, region, or component interposed therebetween. It will be also understood that being "connected" may refer to being "electrically connected." It will be understood that when a layer, region, or component is referred to as being "electrically connected" to another layer, region, or component, it may be "directly electrically connected" to the other layer, region, or component and/or may be "indirectly electrically connected" to other layer, region, or component with another layer, region, or component interposed therebetween.

The term "overlap" and the like may include layer, stack, face or facing, extending over, covering or partly covering or any other suitable term as would be appreciated and understood by those of ordinary skill in the art.

Spatially relative terms, such as "beneath", "below", "lower", "bottom", "above", "upper", "top" and the like, may be used herein for ease of description to describe one element's relationship to another element(s) as illustrated in the figures. Changing the orientation of an apparatus incorporating such an element may change the spatially relative orientation of the element to the other element(s), but such would still be understood to be within the scope of the disclosure.

FIG. 1 is a schematic plan view of a display device 1 according to an embodiment.

Referring to FIG. 1, the display device 1 may include a display area DA and a non-display area NDA. The display area DA may display an image, and the non-display area NDA may not display an image. The display device 1 may display an image by using light emitted from pixels P that may be disposed in the display area DA. Each pixel P may emit red, green, blue, or white light.

The display device 1 may be an apparatus that may display an image and may include a game console, a multi-media apparatus, or a mobile apparatus such as an ultra-miniaturized personal computer. The display device 1 may be an apparatus that may display an image and may be of various technologies, for example, a liquid crystal display, an electrophoretic display, an organic light-emitting display, an inorganic light-emitting display, a field emission display, a surface-conduction electron-emitter display, a quantum dot display, a plasma display or a cathode ray display. Hereinafter, though the display device according to an embodiment may be described as an organic light-emitting display device as an example, embodiments may use various type of display device technologies described above.

A pixel P may be electrically connected to a scan line SLn and a data line DLm. The scan line SLn may extend in an x-direction and the data line DLm may extend in a y-direction.

Figure 2:
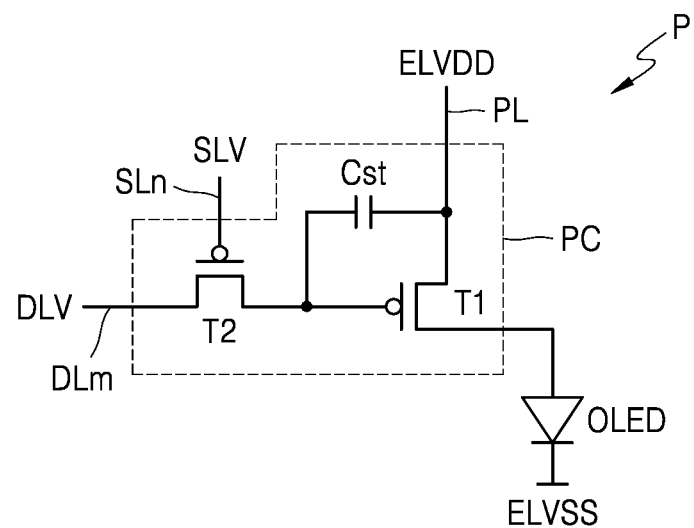
FIG. 2 is a schematic circuit diagram of a pixel included in a display device according to an embodiment.

FIG. 2 is a schematic circuit diagram of a pixel included in a display device according to an embodiment.

Referring to FIG. 2, a pixel P may include a pixel circuit PC and an organic light-emitting diode OLED, the organic light-emitting diode OLED being a display element connected to the pixel circuit PC.

The pixel circuit PC may include a driving thin film transistor T1, a switching thin film transistor T2, and a storage capacitor Cst. Each pixel P may emit, for example, red, green, or blue light, or emit red, green, blue, or white light through the organic light-emitting diode OLED.

The switching thin film transistor T2 may be connected to the scan line SLn and the data line DLm and that transfers a data voltage DLV input from the data line DLm to the driving thin film transistor T1 based on a switching voltage SLV input from the scan line SLn. The storage capacitor Cst may be connected to the switching thin film transistor T2 and a driving voltage line PL and may store a voltage corresponding to a difference between a voltage transferred from the switching thin film transistor T2 and a first power voltage ELVDD supplied to the driving voltage line PL.

The driving thin film transistor T1 may be connected to the driving voltage line PL and the storage capacitor Cst and that may control a driving current flowing through the organic light-emitting diode OLED from the driving voltage line PL in response to a voltage stored in the storage capacitor Cst. The organic light-emitting diode OLED may emit light having a brightness by using the driving current. An opposite electrode (e.g. a cathode) of the organic light-emitting diode OLED may receive a second power voltage ELVSS.

Though it may be shown in FIG. 2 that the pixel circuit PC includes two thin film transistors and one storage capacitor, the embodiment is not limited thereto. The number of thin film transistors and the number of storage capacitors may be variously changed depending on the design of the pixel circuit PC. For example, the pixel circuit PC may further include one or more thin film transistors in addition to the two thin film transistors.

Figure 3:
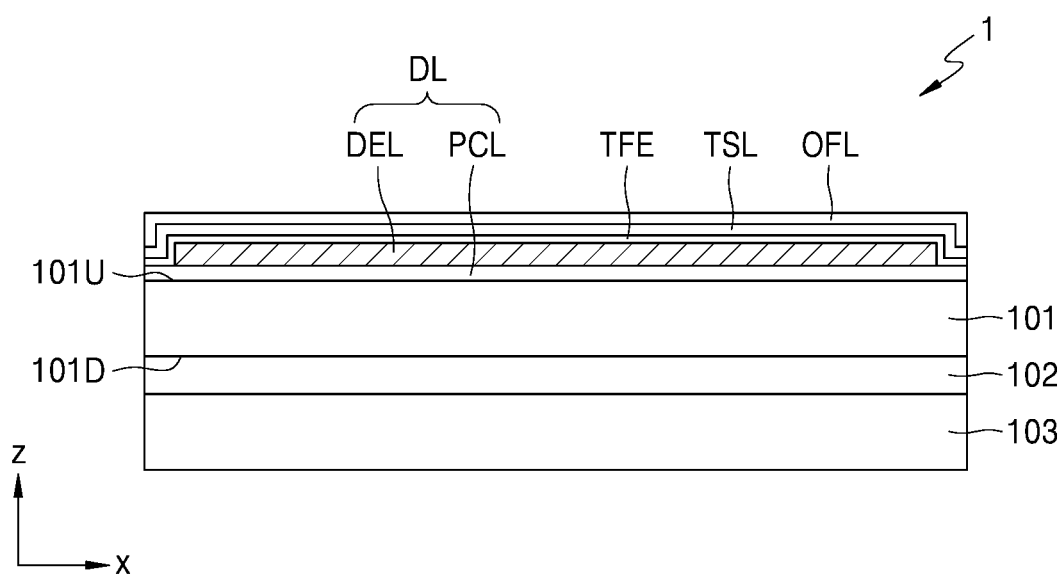
FIG. 3 is a schematic cross-sectional view of a display device according to an embodiment.

FIG. 3 is a schematic cross-sectional view of a display device 1 according to an embodiment.

Referring to FIG. 3, a display layer DL may be disposed on a top surface 101U of a substrate 101 of the display device 1. The display layer DL may include a pixel circuit layer PCL and a display element layer DEL. The pixel circuit layer PCL may include a pixel circuit and insulating layers, and the display element layer DEL may include display elements on the pixel circuit layer PCL. A bottom buffer layer 102 and a bottom planarization layer 103 may be disposed on a bottom surface 101D of the substrate 101.

The substrate 101 may include glass or a polymer resin such as a polyethersulfone, polyarylate, polyetherimide, polyethylene naphthalate, polyethylene terephthalate, polyphenylene sulfide, polyimide, polycarbonate, cellulose triacetate, cellulose acetate propionate, or a combination thereof.

The bottom buffer layer 102 may be disposed on the bottom surface 101D of the substrate 101. The bottom buffer layer 102 may include an inorganic insulating material or an organic insulating material. In an embodiment, the bottom buffer layer 102 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. In another embodiment, the bottom buffer layer 102 may include an organic insulating material including a general-purpose polymer such as an imide-based polymer, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof. Hereinafter, for convenience of description, a case where the bottom buffer layer 102 includes an inorganic insulating material may be described.

The bottom planarization layer 103 may be disposed under the bottom buffer layer 102. Similarly to the bottom buffer layer 102, the bottom planarization layer 103 may include an inorganic insulating material or an organic insulating material. Hereinafter, for convenience of description, the case where the bottom planarization layer 103 includes an organic insulating material may be described.

In an embodiment, a bottom insulating layer (not shown) may be further disposed under the bottom planarization layer 103.

The display element layer DEL may include display elements. For example, the display element layer DEL may include the organic light-emitting diode OLED described above. The pixel circuit layer PCL may include the pixel circuit and the insulating layers each connected to each organic light-emitting diode OLED. The pixel circuit layer PCL may include transistors, storage capacitors, and the insulating layers therebetween.

The display elements may be covered by an encapsulation member such as a thin-film encapsulation layer TFE.

In an embodiment, the thin-film encapsulation layer TFE may include at least one inorganic encapsulation layer and at least one organic encapsulation layer each covering the display element layer DEL. The inorganic encapsulation layer may include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), or silicon oxynitride (SiON). The organic encapsulation layer may include a polymer-based material. The polymer-based material may include an acryl-based resin, an epoxy-based resin, polyimide, polyethylene, or a combination thereof. In an embodiment, the organic encapsulation layer may include acrylate.

In another embodiment, the thin-film encapsulation layer TFE may have a structure in which the substrate 101 may be coupled to a top substrate, which may be a transparent member, by using a sealing member such that an inner space between the substrate 101 and the top substrate may be sealed. A moisture absorber or a filling material may be disposed in the inner space. The sealing member may be sealant. In another embodiment, the sealing member may include a material hardened by a laser. For example, the sealing member may be frit. Specifically, the sealing member may include a urethane-based resin, an epoxy-based resin, an acryl-based resin, which may be organic sealants, silicon, which may be organic sealant, or a combination thereof. As a urethane-based resin, urethane acrylate, etc. may be used, for example. As an acryl-based resin, butyl acrylate, ethylhexyl acrylate, etc., or a combination thereof may be used, for example. The sealing member may include a material hardened by heat.

Hereinafter, the case where the thin-film encapsulation layer TFE includes at least one inorganic encapsulation layer and at least one organic encapsulation layer may be described.

An input sensing layer TSL including touch electrodes may be disposed on the thin-film encapsulation layer TFE. An optical functional layer OFL may be disposed on the input sensing layer TSL. The input sensing layer TSL may obtain coordinate information corresponding to an external input, for example, a touch event. The optical functional layer OFL may reduce reflectivity of light (external light) incident toward the display device 1 from the outside and/or improve color purity of light emitted from the display device 1. In an embodiment, the optical functional layer OFL may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals disposed in an arrangement. Each of the retarder and the polarizer may further include a protective film.

In another embodiment, the optical functional layer OFL may include a black matrix and color filters. The color filters may be disposed by taking into account colors of pieces of light emitted respectively from the pixels of the display device 1. Each color filter may include red, green, or blue pigment or dye. In another example, each color filter may further include a quantum dot in addition to the pigment or dye. In another example, some color filters may not include the pigment or dye and may include scattering particles such as titanium oxide.

In another embodiment, the optical functional layer OFL may include a destructive interference structure. The destructive interference structure may include a first reflection layer and a second reflection layer respectively disposed on different layers. First-reflected light and second-reflected light respectively reflected by the first reflection layer and the second reflection layer may create destructive-interference and thus the reflectivity of external light may be reduced.

An adhesive member may be disposed between the input sensing layer TSL and the optical functional layer OFL. The adhesive member may employ a general member known in the art without limitation. The adhesive member may include a pressure sensitive adhesive (PSA).

Figure 4:
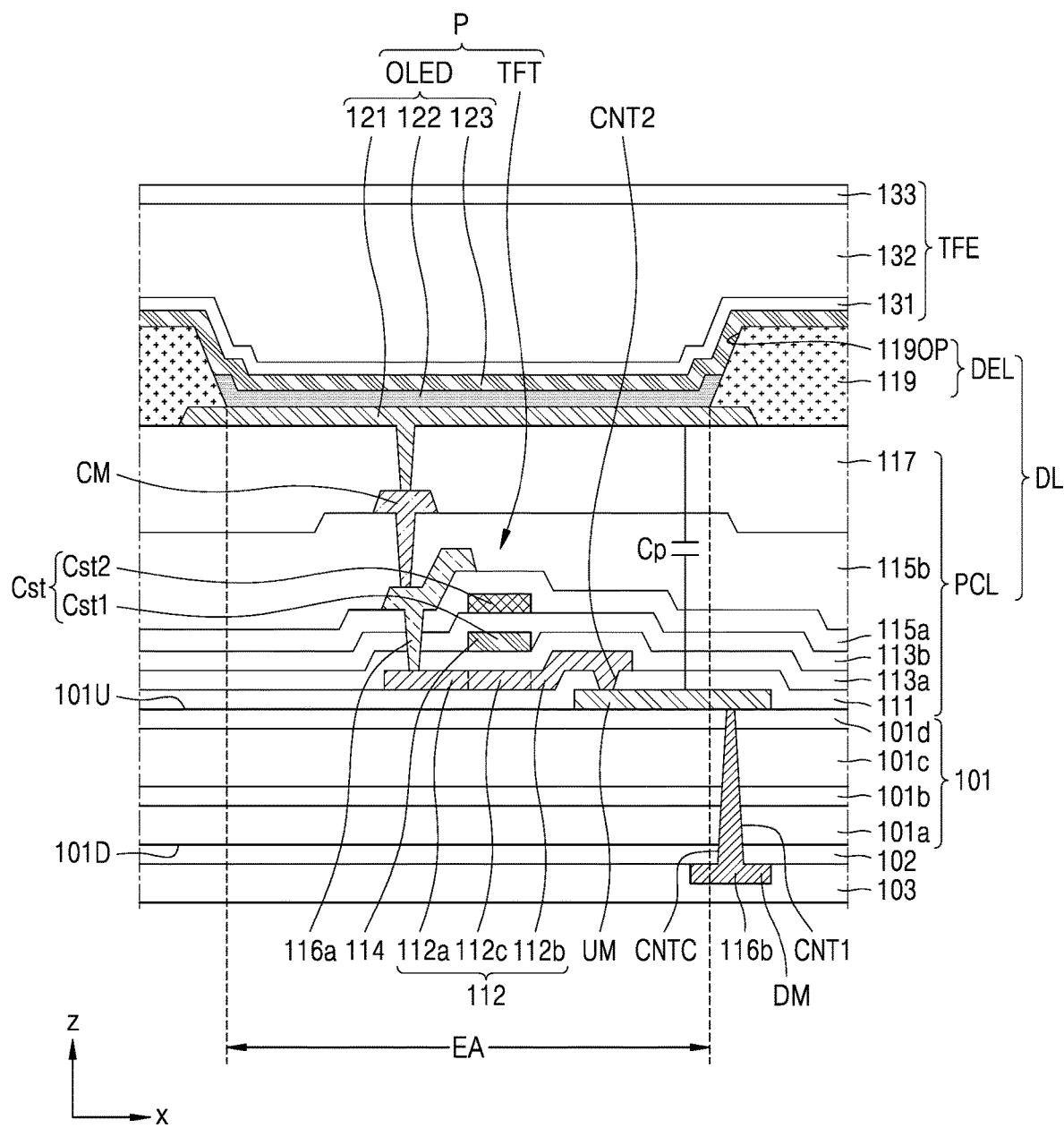
FIG. 4 is a schematic cross-sectional view of a pixel of a display device according to an embodiment.

FIG. 4 is a schematic cross-sectional view of a pixel of a display device according to an embodiment. In FIG. 4, since the same reference numerals as those of FIG. 3 denote the same elements, repeated description thereof may be omitted.

Referring to FIG. 4, the display layer DL and the thin-film encapsulation layer TFE may be disposed on the top surface 101U of the substrate 101. The display layer DL may include the pixel circuit layer PCL and the display element layer DEL. The pixel circuit layer PCL may include the pixel circuit and the insulating layers, and the display element layer DEL may include display elements. The display element layer DEL may include display elements, for example, the organic light-emitting diode OLED described above. The pixel circuit layer PCL may include the pixel circuit and the insulating layers each connected to each organic light-emitting diode OLED. The pixel circuit layer PCL may include transistors, storage capacitors, and the insulating layers therebetween.

The bottom buffer layer 102 and the bottom planarization layer 103 may be disposed on the bottom surface 101D of the substrate 101.

In an embodiment, the substrate 101 may have a multi-layered structure including a polymer resin. For example, as shown in FIG. 4, the substrate 101 may include a first base layer 101a, a first barrier layer 101b, a second base layer 101c, and a second barrier layer 101d that may be stacked (e.g., sequentially stacked).

The first base layer 101a and the second base layer 101c each may include a polymer resin. For example, the first base layer 101a and the second base layer 101c may include a polymer resin such as a polyethersulfone, polyarylate, polyetherimide, polyethylene naphthalate, polyethylene terephthalate, polyphenylene sulfide, polyimide, polycarbonate, cellulose triacetate, cellulose acetate propionate, or a combination thereof.

The first barrier layer 101b and the second barrier layer 101d may be barrier layers preventing the penetration of external foreign substances and may include a single layer or a multi-layer including an inorganic material such as silicon nitride ($SiN_x$) and silicon oxide ($SiO_x$).

In another embodiment, the substrate 101 may include glass. Hereinafter, for convenience of description, the case where the substrate 101 includes the first base layer 101a, the first barrier layer 101b, the second base layer 101c, and the second barrier layer 101d that may be stacked (e.g., sequentially stacked) may be described.

In an embodiment, the substrate 101 may include a first contact hole CNT1 passing through the top surface 101U and the bottom surface 101D. Specifically, the first contact hole CNT1 may pass through the first base layer 101a, the first barrier layer 101b, the second base layer 101c, and the second barrier layer 101d. In another example, the first contact hole CNT1 may include contact holes formed in the first base layer 101a, the first barrier layer 101b, the second base layer 101c, and the second barrier layer 101d and overlapping each other. The first contact hole CNT1 may be formed by etching the substrate 101 in a direction from the bottom surface 101D to the top surface 101U of the substrate 101. A method of manufacturing the first contact hole CNT1 is described.

In an embodiment, a top conductive pattern UM may be disposed on the top surface 101U of the substrate 101. The top conductive pattern UM may be disposed between the substrate 101 and a thin film transistor TFT. The top conductive pattern UM may include aluminum (Al), platinum (Pt), palladium (Pd), silver (Ag), magnesium (Mg), gold (Au), neodymium (Nd), iridium (Ir), chrome (Cr), nickel (Ni), calcium (Ca), molybdenum (Mo), titanium (Ti), tungsten (W), and/or copper (Cu). In an embodiment, the top conductive pattern UM may include a conductive oxide such as indium tin oxide (ITO), zinc oxide (IZO), zinc oxide (ZnO), indium oxide ($In_2O_3$), indium gallium oxide (IGO), and aluminum zinc oxide (AZO), or a combination thereof, and may include a single layer or a multi-layer including the above materials.

In an embodiment, the top conductive pattern UM may be disposed to correspond to the first contact hole CNT1. Therefore, the first contact hole CNT1 of the substrate 101 may be shielded by the top conductive pattern UM.

In an embodiment, the bottom buffer layer 102 may be disposed on the bottom surface 101D of the substrate 101. The bottom buffer layer 102 may include a bottom contact hole CNTC corresponding to the first contact hole CNT1. The bottom contact hole CNTC may be connected to the first contact hole CNT1.

In an embodiment, a bottom conductive pattern DM may be disposed on the bottom surface 101D of the substrate 101. In other words, the bottom conductive pattern DM may be disposed on a surface opposite to the top surface 101U. Specifically, the bottom conductive pattern DM may be disposed under the bottom buffer layer 102.

In an embodiment, the bottom conductive pattern DM may be connected to the top conductive pattern UM through the first contact hole CNT1. The bottom conductive pattern DM may be disposed to correspond to the first contact hole CNT1. Specifically, the bottom conductive pattern DM may be connected to the top conductive pattern UM through the first contact hole CNT1 and the bottom contact hole CNTC.

The bottom conductive pattern DM may include a conductive material including Al, Cu, Ti, or a combination thereof, and may include a single layer or a multi-layer including the above materials. In an embodiment, the bottom conductive pattern DM may have a multi-layered structure of Ti/Al/Ti.

The bottom planarization layer 103 may be disposed under the bottom buffer layer 102. The bottom planarization layer 103 may planarize the bottom surface 101D of the substrate 101. In an embodiment, the bottom planarization layer 103 may cover the bottom conductive pattern DM.

The pixel circuit layer PCL may be disposed on the top surface 101U of the substrate 101. The pixel circuit layer PCL may include a buffer layer 111, the thin film transistor TFT, a first gate insulating layer 113a, a second gate insulating layer 113b, a first interlayer insulating layer 115a, and a second interlayer insulating layer 115b.

The buffer layer 111 may cover the top conductive pattern UM. The buffer layer 111 may include an inorganic insulating material such as silicon oxide ($SiO_2$), silicon nitride ($SiN_x$), silicon oxynitride (SiON), or a combination thereof, and may include a single layer or a multi-layer including the inorganic insulating material.

In an embodiment, the buffer layer 111 may include a second contact hole CNT2. The second contact hole CNT2 may be disposed on the top conductive pattern UM. The second contact hole CNT2 may be disposed apart from the first contact hole CNT1. Specifically, the first contact hole CNT1 may be disposed apart from the second contact hole CNT2 in a second direction (e.g. an x-direction) intersecting a first direction (e.g. a z-direction) perpendicular to the top surface 101U of the substrate 101.

In case that the first contact hole CNT1 may be disposed to correspond to the second contact hole CNT2, moisture, etc. introduced through the first contact hole CNT1 may be easily introduced to the second contact hole CNT2. and a semiconductor layer 112 may be exposed to moisture.

In an embodiment, since the first contact hole CNT1 may be disposed apart from the second contact hole CNT2 in the second direction, moisture, etc. introduced through the first contact hole CNT1 may be prevented from being introduced to the semiconductor layer 112 through the second contact hole CNT2. Therefore, the semiconductor layer 112 may be prevented from being exposed to external moisture, etc.

The thin film transistor TFT may include the semiconductor layer 112. At least a portion of the semiconductor layer 112 may overlap the top conductive pattern UM. In an embodiment, a portion of the semiconductor layer 112 may overlap the top conductive layer UM. The semiconductor layer 112 may include a step difference. In another embodiment, the semiconductor layer 112 may entirely overlap the top conductive pattern UM.

In an embodiment, the semiconductor layer 112 may be connected to the top conductive pattern UM through the second contact hole CNT2. Specifically, the semiconductor layer 112 may overlap at least a portion of the top conductive pattern UM. Since the semiconductor layer 112 may be disposed to correspond to the second contact hole CNT2, the semiconductor layer 112 may be connected to the top conductive pattern UM through the second contact hole CNT2.

The semiconductor layer 112 may include polycrystalline silicon. In another example, the semiconductor layer 112 may include amorphous silicon, an oxide semiconductor, an organic semiconductor, or a combination thereof. The semiconductor layer 112 may include a channel region 112c, a drain region 112a, and a source region 112b. The drain region 112a and the source region 112b may be disposed on two opposite sides of the channel region 112c. A gate electrode 114 may overlap the channel region 112c.

The gate electrode 114 may include a low-resistance metal material. The gate electrode 114 may include a conductive material including Mo, Al, Cu, Ti, or a combination thereof, and may include a single layer or a multi-layer including the above materials.

The first gate insulating layer 113a between the semiconductor layer 112 and the gate electrode 114 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof.

The second gate insulating layer 113b may cover the gate electrode 114. Similarly to the first gate insulating layer 113a, the second gate insulating layer 113b may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof.

A top electrode Cst2 of the storage capacitor Cst may be disposed on the second gate insulating layer 113b. The top electrode Cst2 may overlap the gate electrode 114. The gate electrode 114 and the top electrode Cst2 may constitute the storage capacitor Cst. The gate electrode 114 may overlap the top electrode Cst2 with the second gate insulating layer 113b therebetween. For example, the gate electrode 114 may serve as a bottom electrode Cst1 of the storage capacitor Cst.

This means that the storage capacitor Cst may overlap the thin film transistor TFT. In another embodiment, the bottom electrode Cst1 of the storage capacitor Cst may be disposed apart from the gate electrode 114 such that the storage capacitor Cst may not overlap the thin film transistor TFT.

The top electrode Cst2 may include aluminum (Al), platinum (Pt), palladium (Pd), silver (Ag), magnesium (Mg), gold (Au), neodymium (Nd), iridium (Ir), chrome (Cr), nickel (Ni), calcium (Ca), molybdenum (Mo), titanium (Ti), tungsten (W), and/or copper (Cu) and may include a single layer or a multi-layer including the above materials.

The first interlayer insulating layer 115a may cover the top electrode Cst2. The first interlayer insulating layer 115a may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The first interlayer insulating layer 115a may include a single layer or a multi-layer including the inorganic insulating material.

In an embodiment, at least one of a drain electrode 116a and a source electrode 116b may be disposed on the first interlayer insulating layer 115a. For example, the drain electrode 116a may be disposed on the first interlayer insulating layer 115a, and the source electrode 116b may be disposed on the bottom surface 101D of the substrate 101. The source electrode 116b may be formed as one body with the bottom conductive pattern DM. As another example, the drain electrode 116a may be disposed on the bottom surface 101D of the substrate 101, and the source electrode 116b may be disposed on the first interlayer insulating layer 115a. Hereinafter, for convenience of description, the case where the drain electrode 116a may be disposed on the first interlayer insulating layer 115a, and the source electrode 116b may be disposed on the bottom surface 101D of the substrate 101 may be described.

The drain electrode 116a and the source electrode 116b may include a material having excellent conductivity. The drain electrode 116a and the source electrode 116b may include a conductive material including Mo, Al, Cu, Ti, or a combination thereof, and may include a single layer or a multi-layer including the above material. In an embodiment, each of the drain electrode 116a and the source electrode 116b may include a multi-layered structure of Ti/Al/Ti.

The second interlayer insulating layer 115b may cover the drain electrode 116a. Similarly to the first interlayer insulating layer 115a, the second interlayer insulating layer 115b may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. The second interlayer insulating layer 115b may include a single layer or a multi-layer including the above inorganic insulating material.

In an embodiment, a connection electrode CM may be disposed on the second interlayer insulating layer 115b. The connection electrode CM may be connected to the drain electrode 116a through a contact hole. The connection electrode CM may connect the thin film transistor TFT to the organic light-emitting diode OLED.

A planarization insulating layer 117 may include an organic insulating layer. The planarization insulating layer 117 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

The display element layer DEL may be disposed on the pixel-defining layer PCL having the above structure. The display element layer DEL may be disposed over the top surface 101U of the substrate 101. The display element layer DEL may include the organic light-emitting diode OLED. A pixel electrode 121 of the organic light-emitting diode OLED may be electrically connected to the thin film transistor TFT through a contact hole of the planarization insulating layer 117.

The pixel electrode 121 may be a conductive oxide such as indium tin oxide (ITO), zinc oxide (IZO), zinc oxide (ZnO), indium oxide ($In_2O_3$), indium gallium oxide (IGO), aluminum zinc oxide (AZO), or a combination thereof. In another embodiment, the pixel electrode 121 may include a reflective layer including Ag, Mg, Al, Pt, Pd, Au, Ni, Nd, Ir, Cr, or a combination thereof. In another embodiment, the pixel electrode 121 may further include a layer on/under the reflective layer, the layer including ITO, IZO, ZnO, $In_2O_3$, or a combination thereof.

A pixel-defining layer 119 may be disposed on the pixel electrode 121, and the pixel-defining layer 119 may include an opening 1190P exposing a central portion of the pixel electrode 121. The pixel-defining layer 119 may include an organic insulating material and/or an inorganic insulating material. The opening 1190P may define an emission area (referred to as an emission area EA, hereinafter) of light emitted from the organic light-emitting diode OLED. For example, a width of the opening 1190P may correspond to a width of the emission area EA.

An emission layer 122 may be disposed in the opening 1190P of the pixel-defining layer 119. The emission layer 122 may include a polymer organic material or a low molecular weight organic material emitting light having a color. Though not shown, a first functional layer and a second functional layer may be respectively disposed under and on the emission layer 122. The first functional layer may include, for example, a hole transport layer (HTL) or include an HTL and a hole injection layer (HIL). The second functional layer may be an element disposed on the emission layer 122 and may be optionally provided. The second functional layer may include an electron transport layer (ETL) and/or an electron injection layer (EIL). Like an opposite electrode 123 described below, the first functional layer and/or the second functional layer may be a common layer entirely covering the substrate 101.

The opposite electrode 123 may include a conductive material having a low work function. For example, the opposite electrode 123 may include a (semi)-transparent layer including Ag, Mg, Al, Pt, Pd, Au, Ni, Nd, Ir, Cr, Li, Ca, or a combination thereof. In another example, the opposite electrode 123 may further include a layer on the (semi)-transparent layer including the above material, the layer including ITO, IZO, ZnO, $In_2O_3$, or a combination thereof.

In an embodiment, the thin-film encapsulation TFE may include at least one inorganic encapsulation layer or at least one organic encapsulation layer. In an embodiment, it is shown in FIG. 4 that the thin-film encapsulation layer TFE may include a first inorganic encapsulation layer 131, an organic encapsulation layer 132, and a second inorganic encapsulation layer 133 that may be stacked (e.g., sequentially stacked).

The first inorganic encapsulation layer 131 and the second inorganic encapsulation layer 133 may include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), or silicon oxynitride (SiON). The organic encapsulation layer 132 may include a polymer-based material. The polymer-based material may include an acryl-based resin, an epoxy-based resin, polyimide, polyethylene, or a combination thereof. In an embodiment, the organic encapsulation layer 132 may include acrylate.

The bottom conductive pattern DM may be disposed on the bottom surface 101D of the substrate 101 to reduce a parasitic capacitance Cp between the pixel electrode 121 and the source electrode 116b.

In the case where the source electrode 116b may be disposed on the first interlayer insulating layer 115a, a distance between the source electrode 116b and the pixel electrode 121 may be less than a distance of the case where the drain electrode 116a may be disposed under the bottom surface 101D of the substrate 101. A value of the parasitic capacitance Cp may increase and a corresponding afterimage issue may increase.

In contrast, according to an embodiment, in the case where the source electrode 116b may be disposed on the bottom surface 101D of the substrate 101, a value of the parasitic capacitance Cp may be reduced and a corresponding afterimage issue may be reduced.

Figure 5:
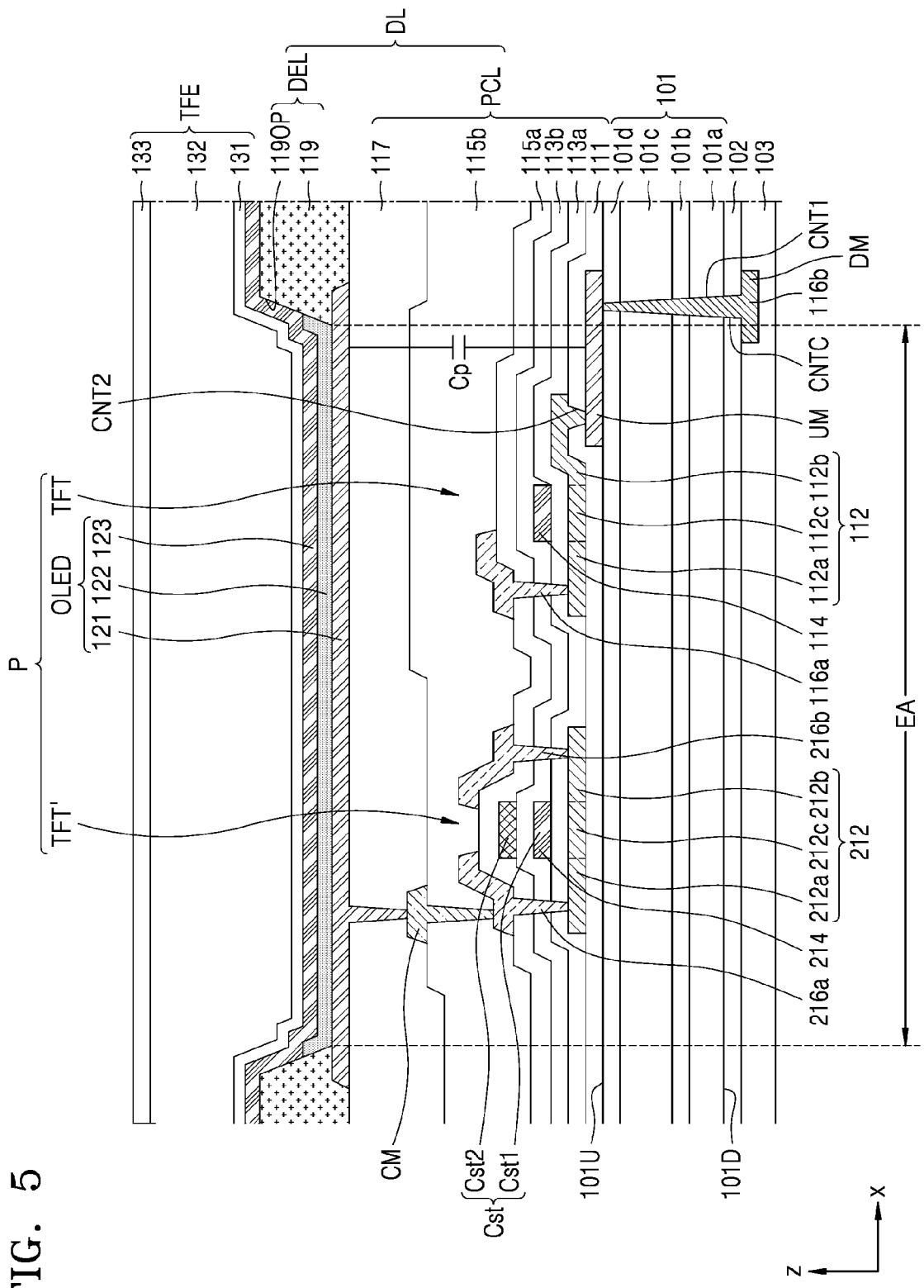
FIG. 5 is a schematic cross-sectional view of a pixel of a display device according to another embodiment.

FIG. 5 is a schematic cross-sectional view of a pixel of a display device according to another embodiment. In FIG. 5, since the same reference numerals as those of FIG. 4 denote the same elements, repeated description thereof may be omitted.

Referring to FIG. 5, the display device may include the substrate 101, the thin film transistor TFT, and the organic light-emitting diode OLED on the top surface 101U, the substrate 101 including the first contact hole CNT1, and the first contact hole CNT1 passing through the top surface 101U and the bottom surface 101D.

The top conductive pattern UM may be disposed between the substrate 101 and the thin film transistor TFT. The top conductive pattern UM may overlap at least a portion of the semiconductor layer 112. The bottom conductive pattern DM may be disposed on the bottom surface 101D of the substrate 101 and connected to the top conductive pattern UM through the first contact hole CNT1. The bottom planarization layer 103 may cover the bottom conductive pattern DM and be disposed on the bottom surface 101D of the substrate 101.

In an embodiment, the display device may further include a second thin film transistor TFT'. The thin film transistor TFT may be a switching thin film transistor, and the second thin film transistor TFT' may be a driving thin film transistor.

The second thin film transistor TFT' may include a second semiconductor layer 212, a second gate electrode 214, a second drain electrode 216a, and a second source electrode 216b.

The second semiconductor layer 212 may be disposed between the buffer layer 111 and the first gate insulating layer 113a. Similarly to the semiconductor layer 112, the second semiconductor layer 212 may include one of polycrystalline silicon, amorphous silicon, an oxide semiconductor, an organic semiconductor, or a combination thereof. The second semiconductor layer 212 may include a second channel region 212c, a second drain region 212a, and a second source region 212b, the second drain region 212a, and the second source region 212b being respectively disposed on two opposite sides of the second channel region 212c. The second gate electrode 214 may overlap the second channel region 212c.

The second gate electrode 214 may be disposed between the first gate insulating layer 113a and the second gate insulating layer 113b. Similarly to the gate electrode 114, the second gate electrode 214 may include a low-resistance metal material.

In an embodiment, the top electrode Cst2 may be disposed between the second gate insulating layer 113b and the first interlayer insulating layer 115a and may overlap the second gate electrode 214. For example, the second gate electrode 214 may serve as the bottom electrode Cst1 of the storage capacitor Cst.

This means that the storage capacitor Cst may overlap the second thin film transistor TFT'. In another embodiment, the bottom electrode Cst1 of the storage capacitor Cst may be disposed apart from the second gate electrode 214 such that the storage capacitor Cst does not overlap the second thin film transistor TFT'.

In an embodiment, at least one of the second drain electrode 216a and the second source electrode 216b may be disposed on the first interlayer insulating layer 115a. For example, the second drain electrode 216a and the second source electrode 216b may be disposed on the first interlayer insulating layer 115a. In another embodiment, similarly to the source electrode 116b, at least one of the second drain electrode 216a and the second source electrode 216b may be disposed on the bottom surface 101D of the substrate 101. Hereinafter, for convenience of description, the case where the second drain electrode 216a and the second source electrode 216b may be disposed on the first interlayer insulating layer 115a may be described.

Similarly to the drain electrode 116a and the source electrode 116b, the second drain electrode 216a and the second source electrode 216b may include a material having excellent conductivity.

In an embodiment, the connection electrode CM may be connected to the second drain electrode 216a through a contact hole. The connection electrode CM may connect the second thin film transistor TFT' to the organic light-emitting diode OLED.

In an embodiment, the bottom conductive pattern DM may be a portion of the data line DLm (see FIG. 2).

The bottom conductive pattern DM may be disposed on the bottom surface 101D (e.g., via buffer layer 102) of the substrate 101 to reduce a parasitic capacitance Cp between the pixel electrode 121 and the source electrode 116b. The bottom conductive pattern DM may be a portion of the data line DLm (see FIG. 2), and the parasitic capacitance Cp may store a voltage corresponding to a difference between the data voltage DLV (see FIG. 2) and a voltage of the pixel electrode 121.

In the case where the source electrode 116b, which may be a portion of a data line, may be disposed on the first interlayer insulating layer 115a, a distance between the source electrode 116b and the pixel electrode 121 may be less than a distance of the case where the drain electrode 116a may be disposed under the bottom surface 101D of the substrate 101. A value of the parasitic capacitance Cp may increase and a corresponding afterimage issue may increase.

In contrast, in the case where the source electrode 116b may be disposed on the bottom surface 101D (e.g., via buffer layer 102) of the substrate 101 according to an embodiment, a value of the parasitic capacitance Cp may be reduced and a corresponding afterimage issue may be reduced.

Figure 6:
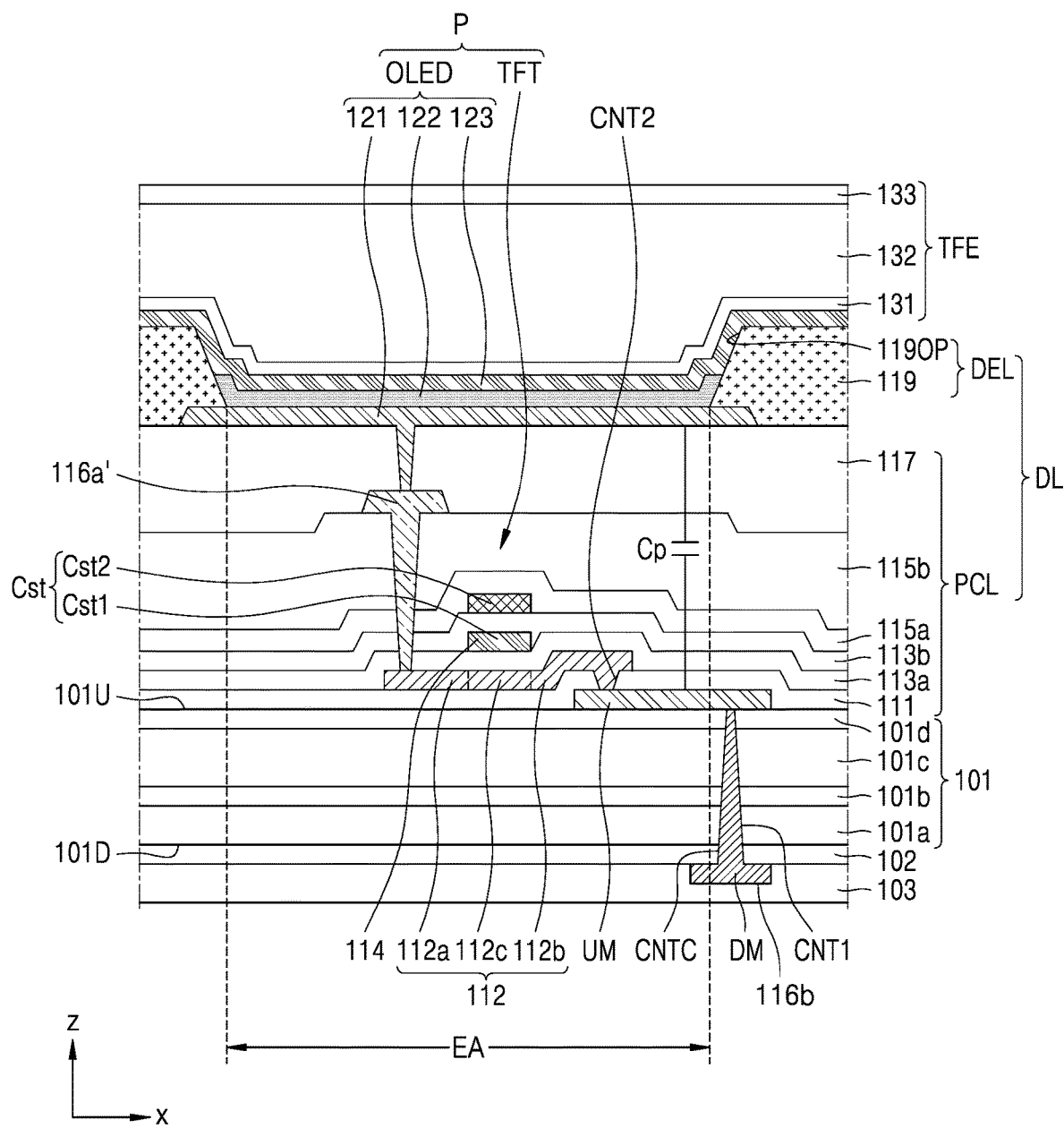
FIG. 6 is a schematic cross-sectional view of a pixel of a display device according to another embodiment.

FIG. 6 is a schematic cross-sectional view of a pixel of a display device according to another embodiment. In FIG. 6, since the same reference numerals as those of FIG. 4 denote the same elements, repeated description thereof may be omitted.

Referring to FIG. 6, the display device may include the substrate 101, the thin film transistor TFT, and the organic light-emitting diode OLED connected to the thin film transistor TFT on the top surface 101U, the substrate 101 including the first contact hole CNT1, and the first contact hole CNT1 passing through the top surface 101U and the bottom surface 101D.

The top conductive pattern UM may be disposed between the substrate 101 and the thin film transistor TFT. The top conductive pattern UM may overlap at least a portion of the semiconductor layer 112. The bottom conductive pattern DM may be disposed on the bottom surface 101D of the substrate 101 and connected to the top conductive pattern UM through the first contact hole CNT1. The bottom planarization layer 103 may cover the bottom conductive pattern DM and be disposed below the bottom surface 101D of the substrate 101.

In an embodiment, a drain electrode 116a' may be disposed on the second interlayer insulating layer 115b. The drain electrode 116a' may be connected to the semiconductor layer 112 through a contact hole. Specifically, the drain electrode 116a' may be connected to the semiconductor layer 112 through contact holes overlapping each other and respectively disposed in the first gate insulating layer 113a, the second gate insulating layer 113b, the first interlayer insulating layer 115a, and the second interlayer insulating layer 115b.

Figure 7:
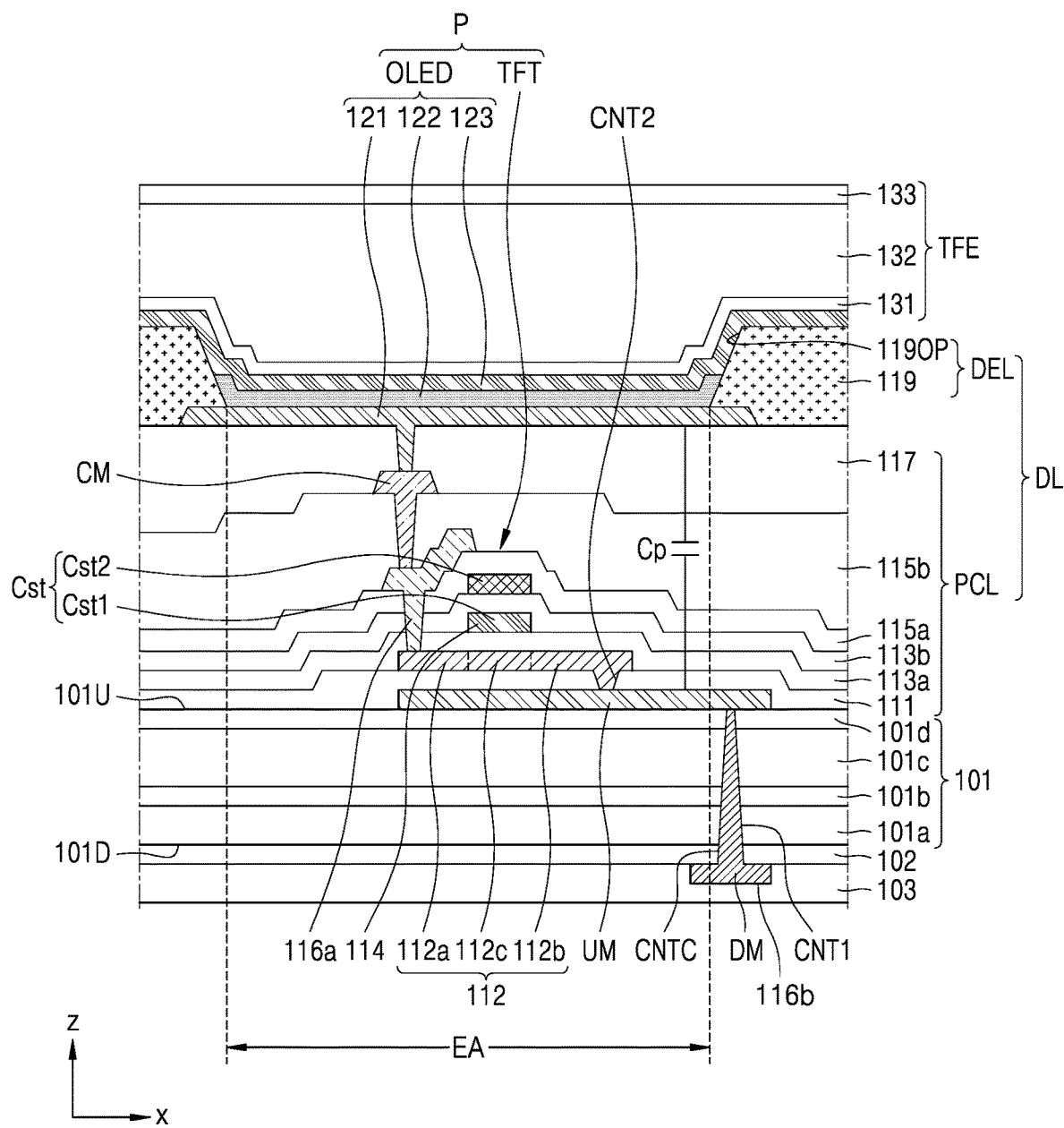
FIG. 7 is a schematic cross-sectional view of a pixel of a display device according to another embodiment.

FIG. 7 is a schematic cross-sectional view of a pixel of a display device according to another embodiment. In FIG. 7, since the same reference numerals as those of FIG. 4 denote the same elements, repeated description thereof may be omitted.

Referring to FIG. 7, the display device may include the substrate 101, the thin film transistor TFT, and the organic light-emitting diode OLED connected to the thin film transistor TFT on the top surface 101U, the substrate 101 including the first contact hole CNT1, and the first contact hole CNT1 passing through the top surface 101U and the bottom surface 101D.

The top conductive pattern UM may be disposed between the substrate 101 and the thin film transistor TFT. The top conductive pattern UM may overlap at least a portion of the semiconductor layer 112. The bottom conductive pattern DM may be disposed on the bottom surface 101D of the substrate 101 and connected to the top conductive pattern UM through the first contact hole CNT1. The bottom planarization layer 103 may cover the bottom conductive pattern DM and be disposed below the bottom surface 101D of the substrate 101.

In an embodiment, the semiconductor layer 112 may entirely overlap the top conductive pattern UM. The semiconductor layer 112 may be disposed on the top conductive pattern UM. The semiconductor layer 112 may not include a step difference and may include a flat bottom surface.

Figure 8:
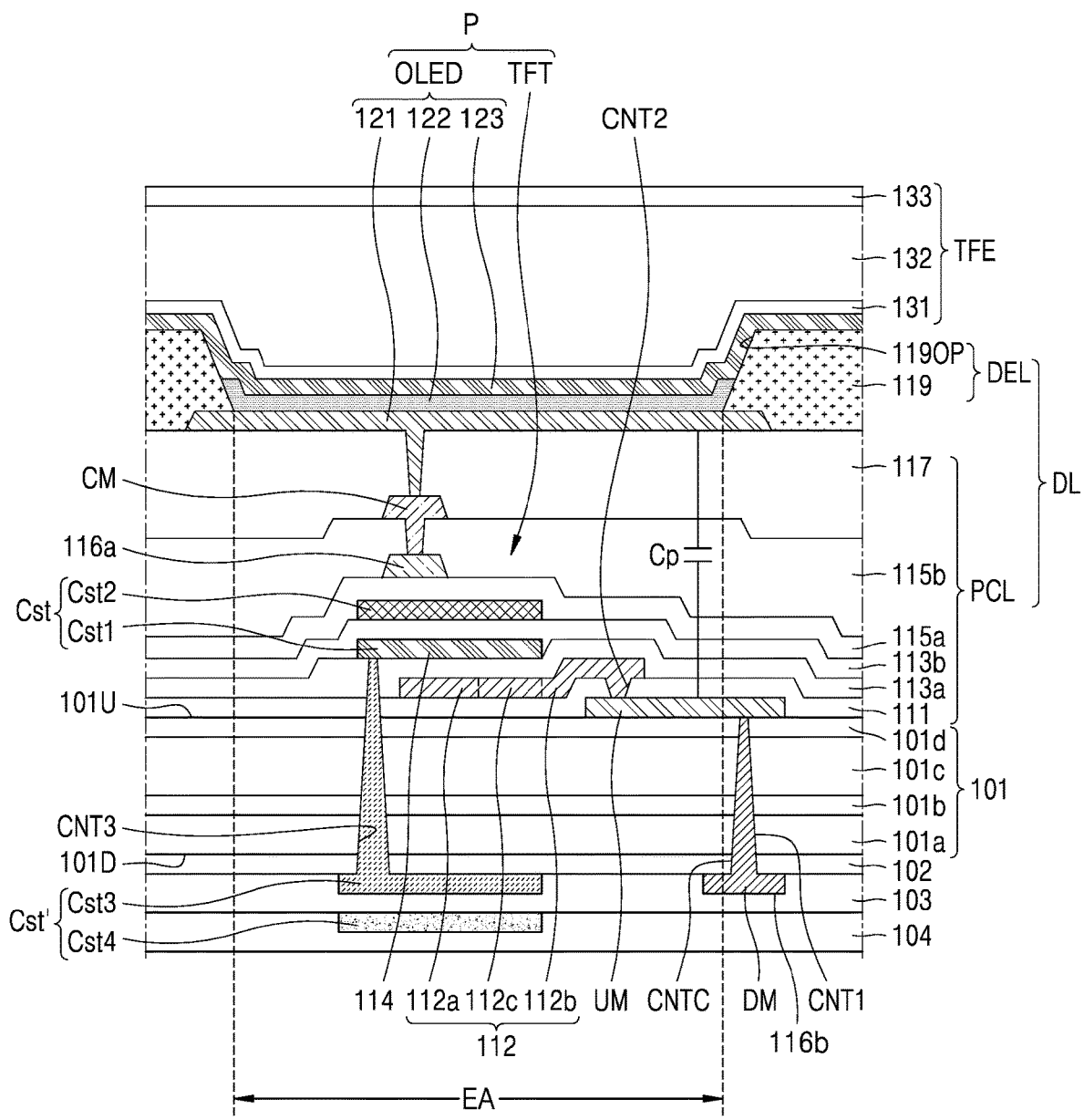
FIG. 8 is a schematic cross-sectional view of a pixel of a display device according to another embodiment.

FIG. 8 is a schematic cross-sectional view of a pixel of a display device according to another embodiment. In FIG. 8, since the same reference numerals as those of FIG. 4 denote the same elements, repeated description thereof may be omitted.

In FIG. 8, to show a figure in which a first bottom electrode Cst3 described below may be connected to the gate electrode 114, one of pixels may be shown from another side. Therefore, the source region of the semiconductor layer 112 may be omitted, and the connection of the drain electrode 116a to the source region of the semiconductor layer 112 may be omitted.

Referring to FIG. 8, the display device may include the substrate 101, the thin film transistor TFT, and the organic light-emitting diode OLED connected to the thin film transistor TFT on the top surface 101U, the substrate 101 including the first contact hole CNT1, and the first contact hole CNT1 passing through the top surface 101U and the bottom surface 101D.

The top conductive pattern UM may be disposed between the substrate 101 and the thin film transistor TFT. The top conductive pattern UM may overlap at least a portion of the semiconductor layer 112. The bottom conductive pattern DM may be disposed on the bottom surface 101D of the substrate 101 and connected to the top conductive pattern UM through the first contact hole CNT1. The bottom planarization layer 103 may cover the bottom conductive pattern DM and be disposed below the bottom surface 101D of the substrate 101.

In an embodiment, the display device may further include the first bottom electrode Cst3. The first bottom electrode Cst3 may be disposed between the substrate 101 and the bottom planarization layer 103. In other words, the first bottom electrode Cst3 may be disposed below the bottom surface 101D of the substrate 101. In an embodiment, the first bottom electrode Cst3 may be disposed on the same layer as a layer on which the bottom conductive pattern DM may be disposed. The first bottom electrode Cst3 may be disposed apart from the bottom conductive pattern DM.

In an embodiment, the first bottom electrode Cst3 may be connected to the gate electrode 114 through a third contact hole CNT3 of the substrate 101. Specifically, the first bottom electrode Cst3 may be connected to the gate electrode 114 through a contact hole of the bottom buffer layer 102, the third contact hole CNT3, a contact hole of the buffer layer 111, and a contact hole of the first gate insulating layer 113a. The contact hole of the bottom buffer layer 102, the third contact hole CNT3, the contact hole of the buffer layer 111, and the contact hole of the first gate insulating layer 113a may overlap each other and thus be provided as one contact hole.

The first bottom electrode Cst3 may include a conductive material including Al, Cu, Ti, or a combination thereof, and may include a single layer or a multi-layer including the above materials. In an embodiment, the first bottom electrode Cst3 may have a multi-layered structure of Ti/Al/Ti.

In an embodiment, a bottom insulating layer 104 may be disposed under the bottom planarization layer 103. Similarly to the bottom planarization layer 103, the bottom insulating layer 104 may include an inorganic insulating material or an organic insulating material. In an embodiment, the bottom insulating layer 104 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In another embodiment, the bottom insulating layer 104 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof. The bottom insulating layer 104 may planarize the bottom surface 101D of the substrate 101. Hereinafter, for convenience of description, the case where the bottom insulating layer 104 includes the organic insulating material may be described.

A second bottom electrode Cst4 may be disposed between the bottom planarization layer 103 and the bottom insulating layer 104. In an embodiment, the second bottom electrode Cst4 may be disposed to correspond to the first bottom electrode Cst3. Therefore, the first bottom electrode Cst3 and the second bottom electrode Cst4 may constitute a bottom storage capacitor Cst'.

The second bottom electrode Cst4 may include a conductive material including Al, Cu, Ti, or a combination thereof, and may include a single layer or a multi-layer including the above materials. In an embodiment, the second bottom electrode Cst4 may have a multi-layered structure of Ti/Al/Ti.

The arrangement in which the first bottom electrode Cst3 may be connected to the gate electrode 114 may be for reducing a resistance of the gate electrode 114. Therefore, an afterimage issue that may occur due to a large resistance of the gate electrode 114 may be solved.

Since the bottom storage capacitor Cst' may be formed over the bottom surface 101D of the substrate 101, a capacitance capacity design range of the storage capacitor may be increased.

Figure 9:
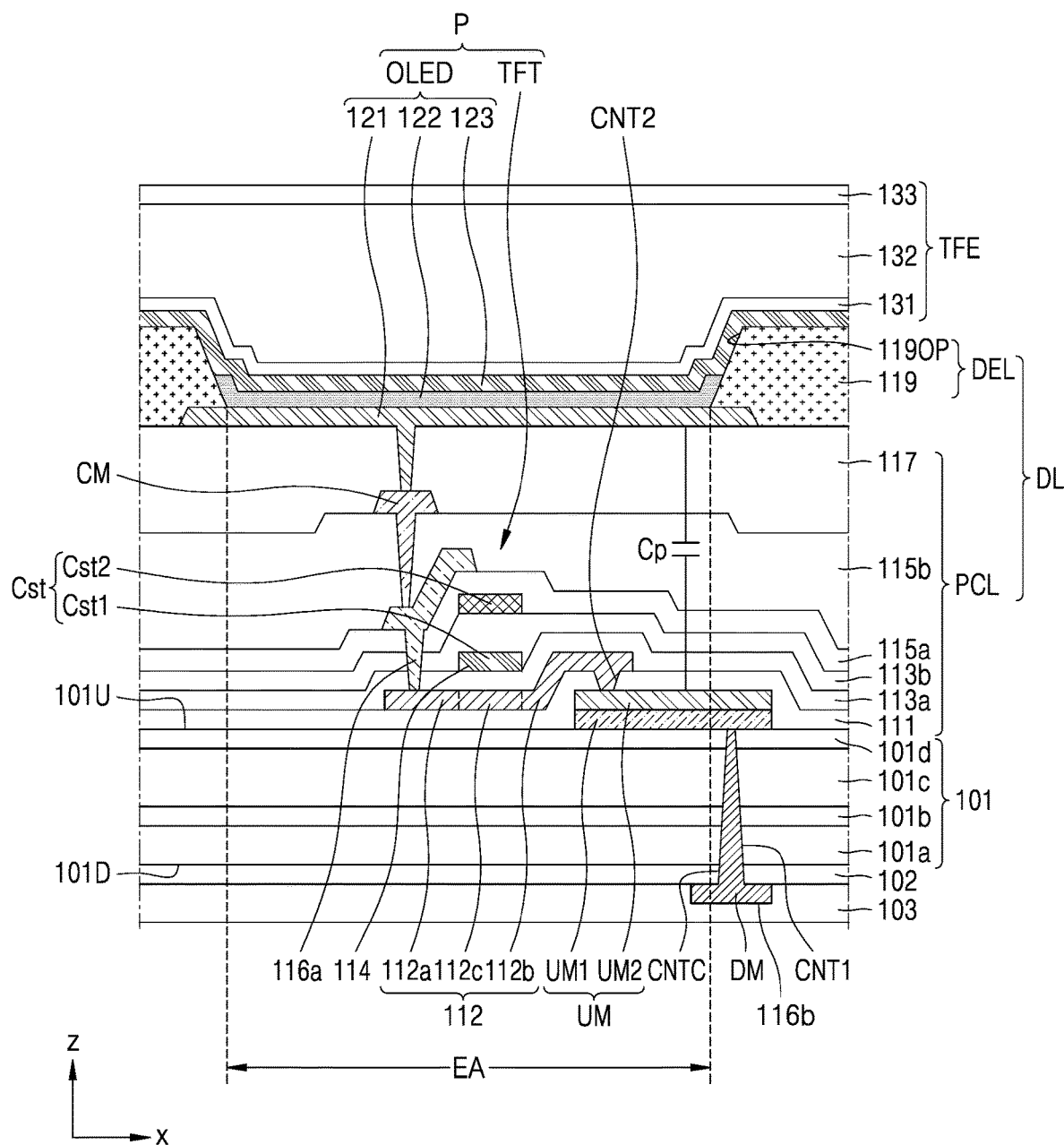
FIG. 9 is a schematic cross-sectional view of a pixel of a display device according to another embodiment.

FIG. 9 is a schematic cross-sectional view of a pixel of a display device according to another embodiment. In FIG. 9, since the same reference numerals as those of FIG. 4 denote the same elements, repeated description thereof may be omitted.

Referring to FIG. 9, the display device may include the substrate 101, the thin film transistor TFT, and the organic light-emitting diode OLED connected to the thin film transistor TFT on the top surface 101U, the substrate 101 including the first contact hole CNT1, and the first contact hole CNT1 passing through the top surface 101U and the bottom surface 101D.

The top conductive pattern UM may be disposed between the substrate 101 and the thin film transistor TFT. The top conductive pattern UM may overlap at least a portion of the semiconductor layer 112. The bottom conductive pattern DM may be disposed on the bottom surface 101D of the substrate 101 and connected to the top conductive pattern UM through the first contact hole CNT1. The bottom planarization layer 103 may cover the bottom conductive pattern DM and be disposed below the bottom surface 101D of the substrate 101.

In an embodiment, the top conductive pattern UM may include a multi-layered structure. For example, the top conductive pattern UM may include a first layer UM1 and a second layer UM2. The second layer UM2 may be disposed on the first layer UM1.

In an embodiment, the second layer UM2 may include a metal different from a metal of the first layer UM1. For example, the first layer UM1 may include a conductive oxide such as indium tin oxide (ITO), zinc oxide (IZO), zinc oxide (ZnO), indium oxide ($In_2O_3$), indium gallium oxide (IGO), aluminum zinc oxide (AZO), or a combination thereof. The first layer UM1 may include the same metal as a metal of the pixel electrode 121. The second layer UM2 may include aluminum (Al), platinum (Pt), palladium (Pd), silver (Ag), magnesium (Mg), gold (Au), neodymium (Nd), iridium (Ir), chrome (Cr), nickel (Ni), calcium (Ca), molybdenum (Mo), titanium (Ti), tungsten (W), and/or copper (Cu).

The top conductive pattern UM may include a multi-layered structure to protect the top conductive pattern UM while the first contact hole CNT1 may be formed. In the case where the first contact hole CNT1 may be formed, a dry etching process may be used and is described below. In case that the substrate 101 may be etched, a portion of the top conductive pattern UM may be damaged by the etching process. In an embodiment, since the top conductive pattern UM may include a multi-layered structure and the first layer UM1 may include a conductive oxide resistant to dry etching, the damage of the second layer UM2 may be prevented.

Figure 10:
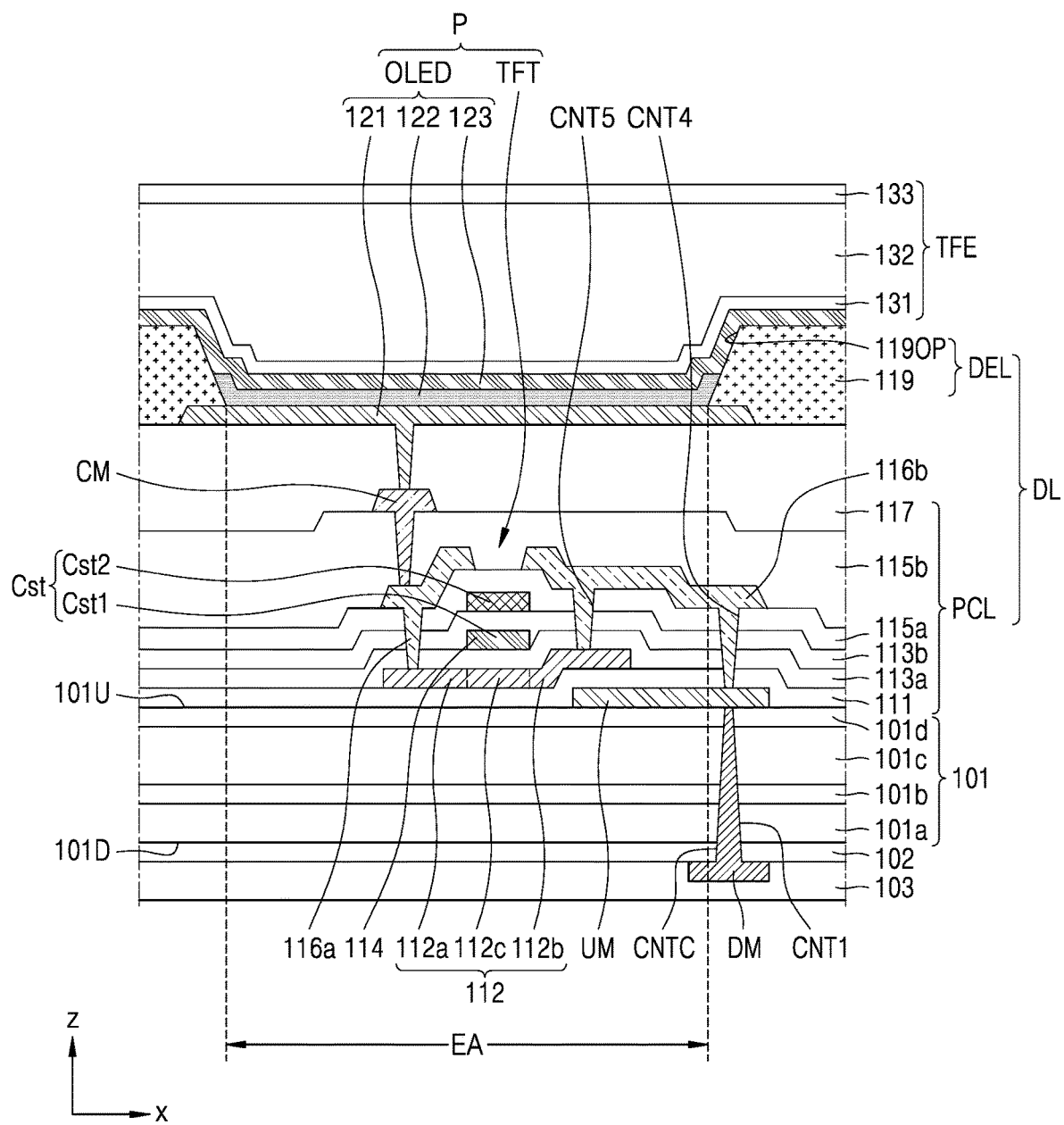
FIG. 10 is a schematic cross-sectional view of a pixel of a display device according to another embodiment.

FIG. 10 is a schematic cross-sectional view of a pixel of a display device according to another embodiment. In FIG. 10, since the same reference numerals as those of FIG. 4 denote the same elements, repeated description thereof may be omitted.

Referring to FIG. 10, the display device may include the substrate 101, the thin film transistor TFT, and the organic light-emitting diode OLED connected to the thin film transistor TFT on the top surface 101U, the substrate 101 including the first contact hole CNT1, and the first contact hole CNT1 passing through the top surface 101U and the bottom surface 101D.

The top conductive pattern UM may be disposed between the substrate 101 and the thin film transistor TFT. The top conductive pattern UM may overlap at least a portion of the semiconductor layer 112. The bottom conductive pattern DM may be disposed on the bottom surface 101D of the substrate 101 and connected to the top conductive pattern UM through the first contact hole CNT1. The bottom planarization layer 103 may cover the bottom conductive pattern DM and be disposed below the bottom surface 101D of the substrate 101.

In an embodiment, the drain electrode 116a and the source electrode 116b may be disposed on the first interlayer insulating layer 115a. The source electrode 116b may be disposed apart from the bottom conductive pattern DM. For example, the source electrode 116b and the bottom conductive pattern DM may not be formed as one body.

In an embodiment, at least one of the drain electrode 116a and the source electrode 116b may be connected to the top conductive pattern UM through a fourth contact hole CNT4. The fourth contact hole CNT4 may include the contact hole of the buffer layer 111, the contact hole of the first gate insulating layer 113a, the contact hole of the second gate insulating layer 113b, and the contact hole of the first interlayer insulating layer 115a that overlap each other.

The source electrode 116b may be connected to the source region 112b of the semiconductor layer 112 through a fifth contact hole CNT5. The fifth contact hole CNT5 may include the contact hole of the first gate insulating layer 113a, the contact hole of the second gate insulating layer 113b, and the contact hole of the first interlayer insulating layer 115a that overlap each other. The fifth contact hole CNT5 may be disposed apart from the fourth contact hole CNT4. Specifically, the fifth contact hole CNT5 may be disposed apart in an x-direction from the fourth contact hole CNT4.

As described above, since the bottom conductive pattern DM and the source electrode 116b may be connected to the top conductive pattern UM, afterimage issues that may occur due to a large resistance of the source electrode 116b may be removed.

Figure 11:
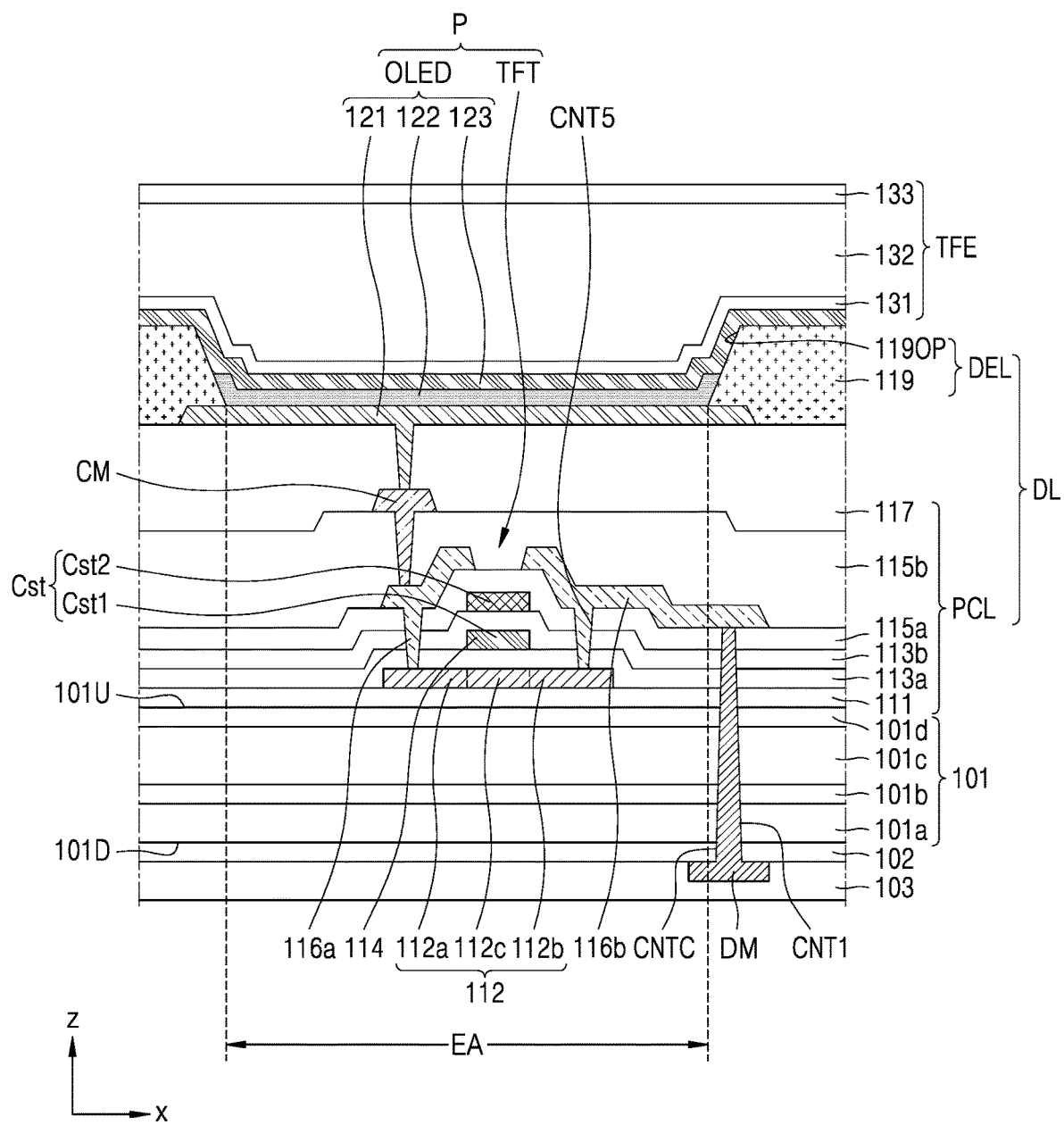
FIG. 11 is a schematic cross-sectional view of a pixel of a display device according to another embodiment.

FIG. 11 is a schematic cross-sectional view of a pixel of a display device according to another embodiment. In FIG. 11, since the same reference numerals as those of FIG. 10 denote the same elements, repeated description thereof may be omitted.

Referring to FIG. 11, the display device may include the substrate 101, the thin film transistor TFT, and the organic light-emitting diode OLED connected to the thin film transistor TFT on the top surface 101U, the substrate 101 including the first contact hole CNT1, and the first contact hole CNT1 passing through the top surface 101U and the bottom surface 101D. The bottom conductive pattern DM may be disposed below the bottom surface 101D of the substrate 101, and the bottom planarization layer 103 may cover the bottom conductive pattern DM.

In an embodiment, the bottom conductive pattern DM may be connected to at least one of the source electrode 116b and the drain electrode 116a through the first contact hole CNT1. The bottom conductive pattern DM may be connected to at least one of the source electrode 116b and the drain electrode 116a through a contact hole including the first contact hole CNT1, the contact hole of the buffer layer 111, the contact hole of the first gate insulating layer 113a, the contact hole of the second gate insulating layer 113b, and the contact hole of the first interlayer insulating layer that overlap each other. The top conductive pattern may be omitted.

Figure 12:
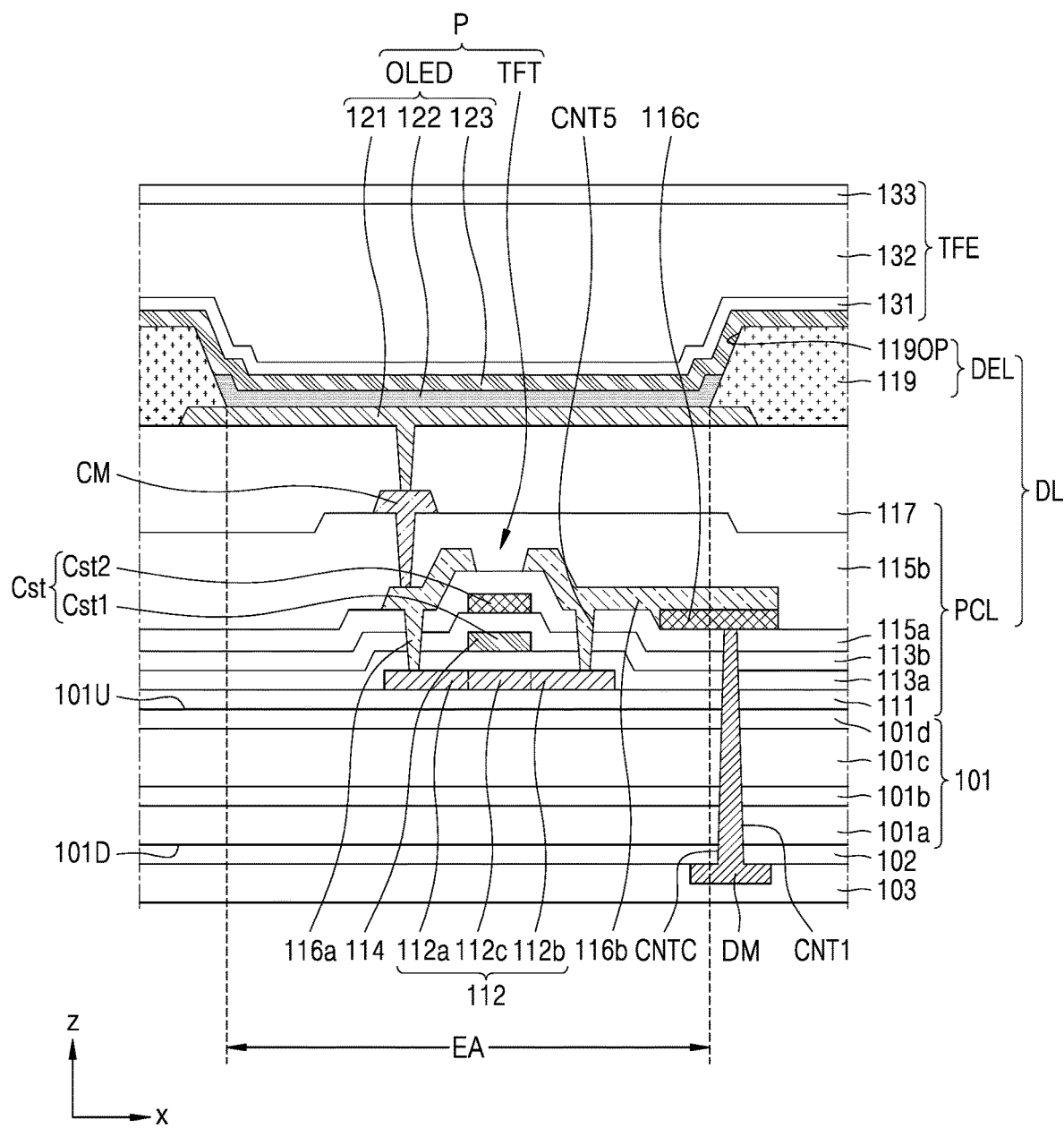
FIG. 12 is a schematic cross-sectional view of a pixel of a display device according to another embodiment.

FIG. 12 is a schematic cross-sectional view of a pixel of a display device according to another embodiment. In FIG. 12, since the same reference numerals as those of FIG. 11 denote the same elements, repeated description thereof may be omitted.

Referring to FIG. 12, the display device may include the substrate 101, the thin film transistor TFT, and the organic light-emitting diode OLED on the top surface 101U, the substrate 101 including the first contact hole CNT1, and the first contact hole CNT1 passing through the top surface 101U and the bottom surface 101D.

The bottom conductive pattern DM may be disposed below the bottom surface 101D of the substrate 101 and connected to at least one of the source electrode 116b and the drain electrode 116a through the first contact hole CNT1. The bottom planarization layer 103 may cover the bottom conductive pattern DM.

In an embodiment, the display device may further include a conductive pattern 116c. The conductive pattern 116c may contact at least a portion of the drain electrode 116a and the source electrode 116b. For example, the conductive pattern 116c may contact a bottom surface of the source electrode 116b. In an embodiment, the conductive pattern 116c may be disposed apart from the fifth contact hole CNT5. The conductive pattern 116c may be disposed to correspond to the first contact hole CNT1.

In an embodiment, the conductive pattern 116c may be connected to the bottom conductive pattern DM through the first contact hole CNT1. Specifically, the conductive pattern 116c may be disposed to correspond to the first contact hole CNT1 and connected to the bottom conductive pattern DM. Therefore, the bottom conductive pattern DM may be connected to the source region 112b of the semiconductor layer 112 through the conductive pattern 116c and the source electrode 116b.

The conductive pattern 116c may include a conductive oxide such as indium tin oxide (ITO), zinc oxide (IZO), zinc oxide (ZnO), indium oxide (In$_2$O$_3$), indium gallium oxide (IGO), or aluminum zinc oxide (AZO). The first layer UM1 may include the same metal as a metal of the pixel electrode 121.

The display device includes the conductive pattern 116c to protect the source electrode 116b while the first contact hole CNT1 may be formed. In the case where the first contact hole CNT1 may be formed, a dry etching process may be used described below. In case that the substrate 101 may be etched, a portion of the source electrode 116b may be damaged by the etching process. In contrast, an embodiment includes a structure in which the conductive pattern 116c may be disposed under the source electrode 116b, and the conductive pattern 116c includes a conductive oxide resistant to dry etching. Therefore, the damage of the source electrode 116b may be prevented.

The bottom conductive pattern DM may be formed over the bottom surface 101D of the substrate 101 by using a manufacturing method described below.

FIGS. 13A to 13G are schematic cross-sectional views of a method of manufacturing a display device according to an embodiment. In FIGS. 13A to 13G, since the same reference numerals as those of FIG. 4 denote the same elements, repeated description thereof may be omitted.

Figure 13A:
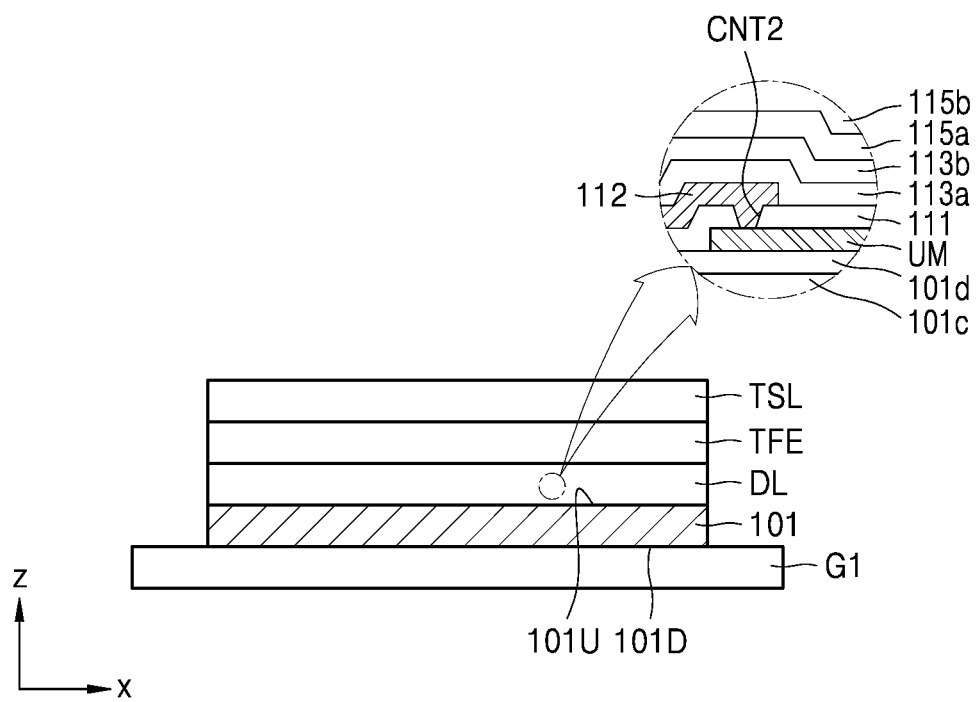
FIGS. 13A to 13G are schematic cross-sectional views for illustrating a method of manufacturing a display device according to an embodiment.

Referring to FIG. 13A, the substrate 101 may be formed on a first carrier substrate G1. A bottom surface 101D of the substrate 101 may face the first carrier substrate G1. In an embodiment, the bottom surface 101D of the substrate 101 may contact the first carrier substrate G1.

In an embodiment, the display layer DL may be formed on the top surface 101U of the substrate 101. The display layer DL may include a pixel circuit layer and a display element layer, the pixel circuit layer including the pixel circuit and the insulating layer, and the display element layer including display elements.

In addition to the display layer DL being formed, the top conductive pattern UM may be formed. The top conductive pattern UM may be formed to correspond to a portion in which the first contact hole CNT1 may be formed.

The display layer DL may include the thin film transistor including the semiconductor layer 112 on the buffer layer 111 covering the top conductive pattern UM, the semiconductor layer 112 overlapping a portion of the top conductive pattern UM. The top conductive pattern UM may be connected to the semiconductor layer 112 through the second contact hole CNT2.

The thin-film encapsulation layer TFE and the input sensing layer TSL may be sequentially disposed on the display layer DL. In an embodiment, an optical functional layer may be further formed.

Figure 13B:
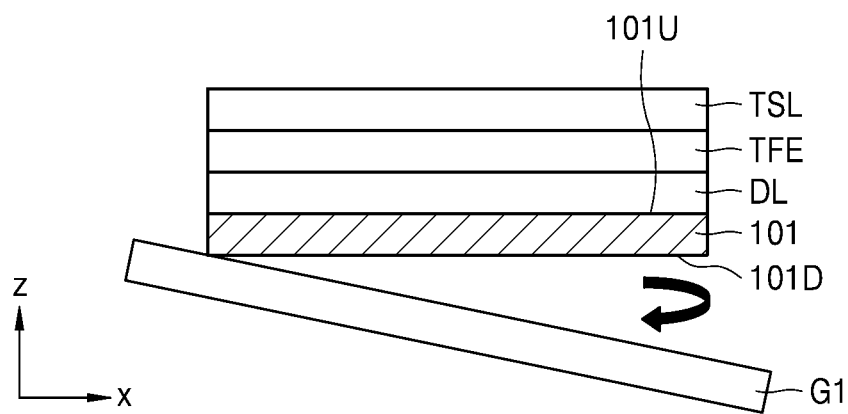

Referring to FIG. 13B, the first carrier substrate G1 may be detached. Specifically, the first carrier substrate G1 may be detached from the bottom surface 101D of the substrate 101. The bottom surface 101D of the substrate 101 may be exposed.

Figure 13C:
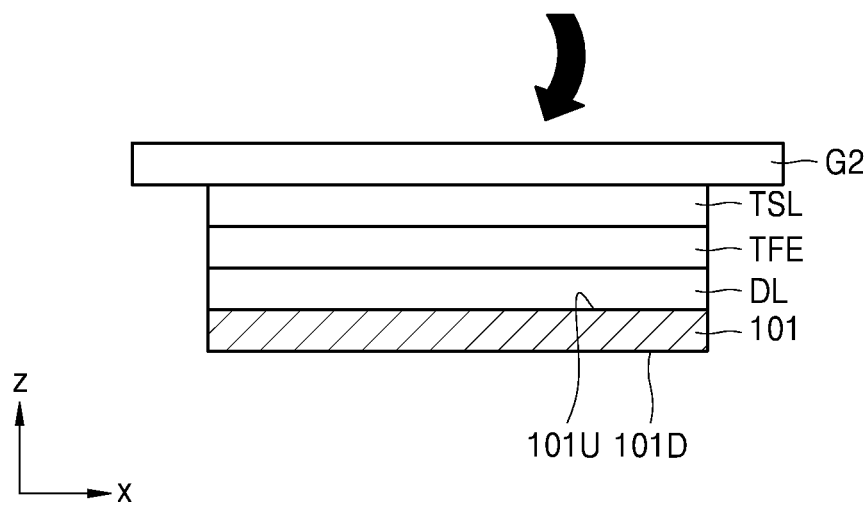

Referring to FIG. 13C, a second carrier substrate G2 may be attached. The second carrier substrate G2 may be attached to face the top surface 101U of the substrate 101. In other words, the second carrier substrate G2 may be attached on the display layer DL.

Figure 13D:
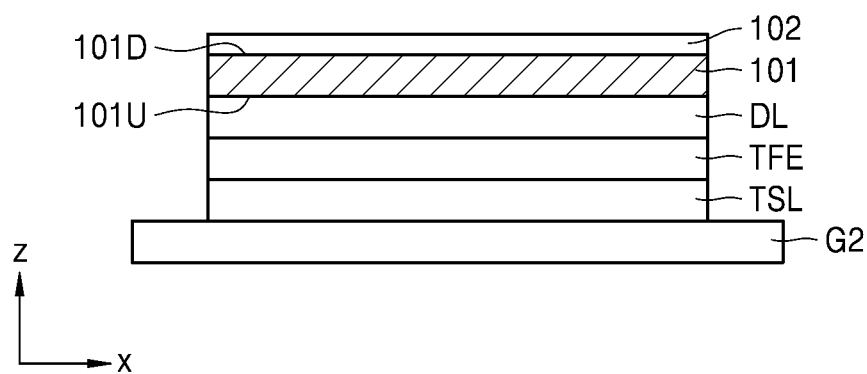

Referring to FIG. 13D, the bottom buffer layer 102 may be formed on the bottom surface 101D of the substrate 101.

Figure 13E:
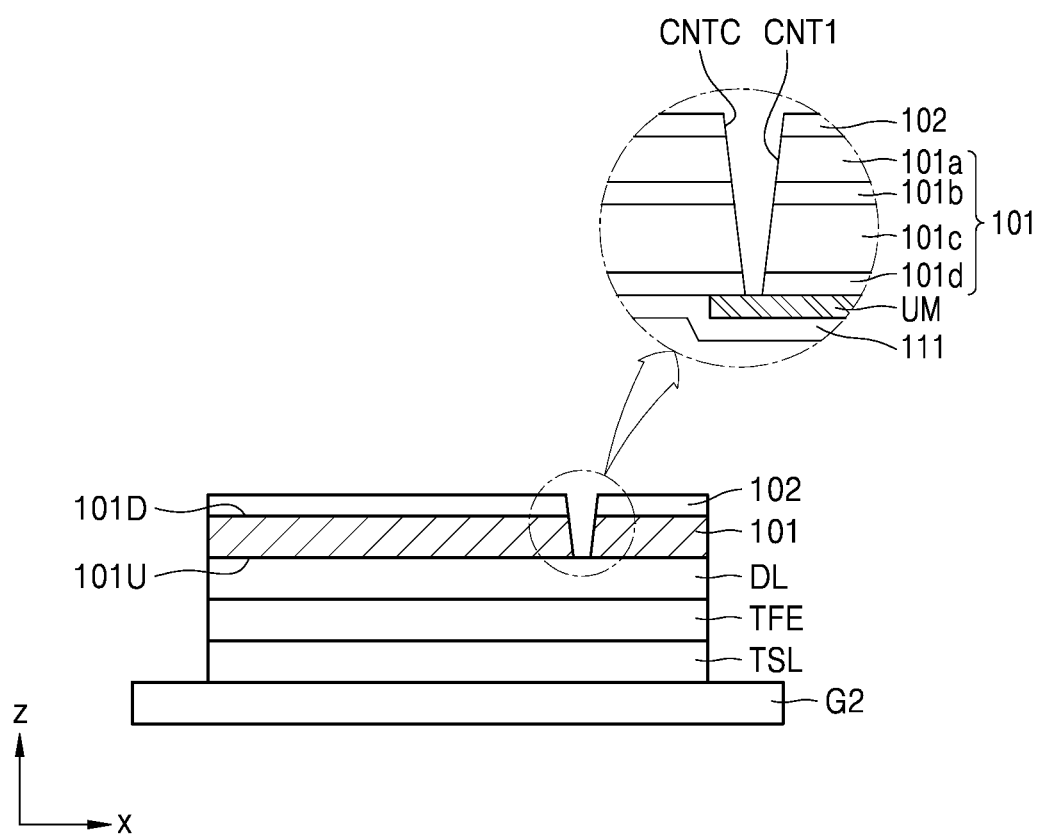

Referring to FIG. 13E, the first contact hole CNT1 may be formed, the first contact hole CNT1 passing through the top surface 101U and the bottom surface 101D of the substrate 101.

The first contact hole CNT1 may be formed by a method described below.

A photoresist pattern may be formed on the bottom buffer layer 102.

A bottom contact hole CNTC may be formed in a top portion of the bottom buffer layer 102. The etching process may be dry etching.

The first contact hole CNT1 may be formed in a top portion of the bottom surface 101D of the substrate 101 by using an etching process. The first contact hole CNT1 may be connected to the bottom contact hole CNTC. The first contact hole CNT1 may expose the top conductive pattern UM. The etching process may be dry etching.

The photoresist pattern may be removed. For a method of removing the photoresist pattern, a known method may be used.

Figure 13F:
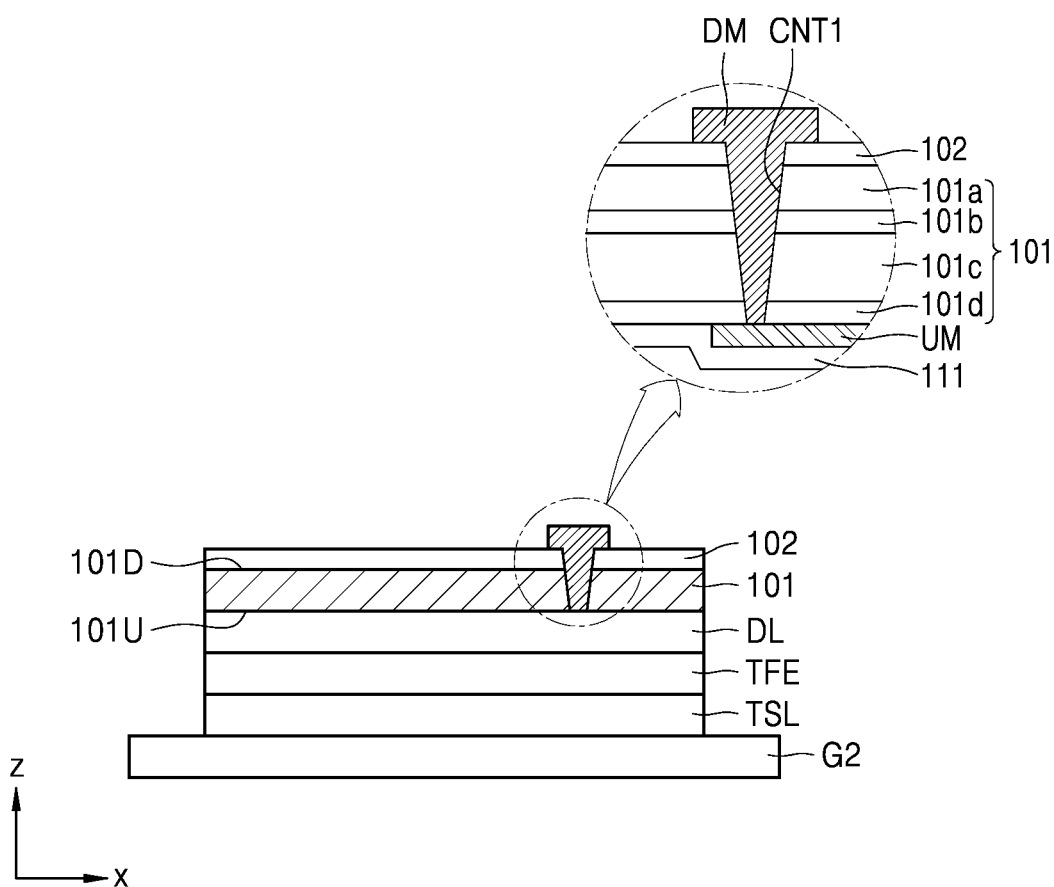

Referring to FIG. 13F, the bottom conductive pattern DM may be formed on the bottom buffer layer 102. The bottom conductive pattern DM may be formed by forming a conductive layer through a deposition process and performing a patterning process. The bottom conductive pattern DM may be formed to correspond to the first contact hole CNT1. The bottom conductive pattern DM may be connected to the top conductive pattern UM through the first contact hole CNT1 and the bottom contact hole CNTC.

Figure 13G:
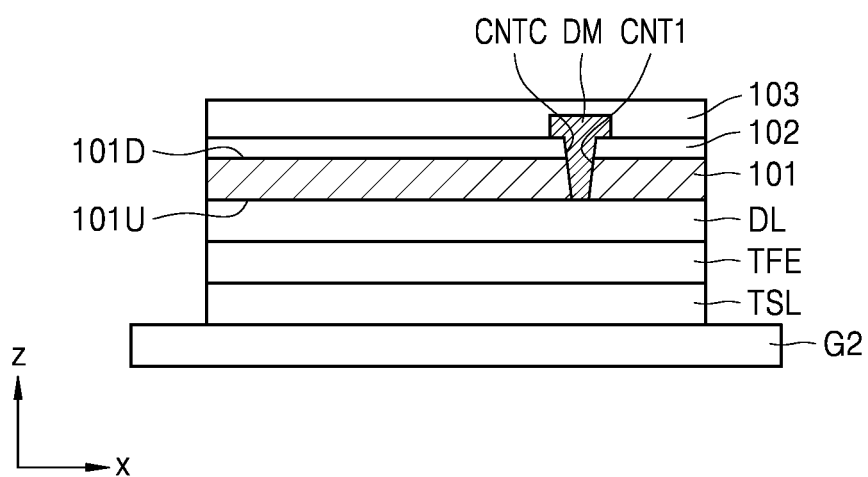

Referring to FIG. 13G, the bottom planarization layer 103 may cover the bottom conductive pattern DM. In an embodiment, in the case where the bottom planarization layer 103 includes an organic material, a top surface of the bottom planarization layer 103 may be flat. In another embodiment, in the case where the bottom planarization layer 103 includes an inorganic material, a chemical mechanical polishing (CMP) process may be additionally performed. A top surface of the bottom planarization layer 103 may be flat.

Figure 14A:
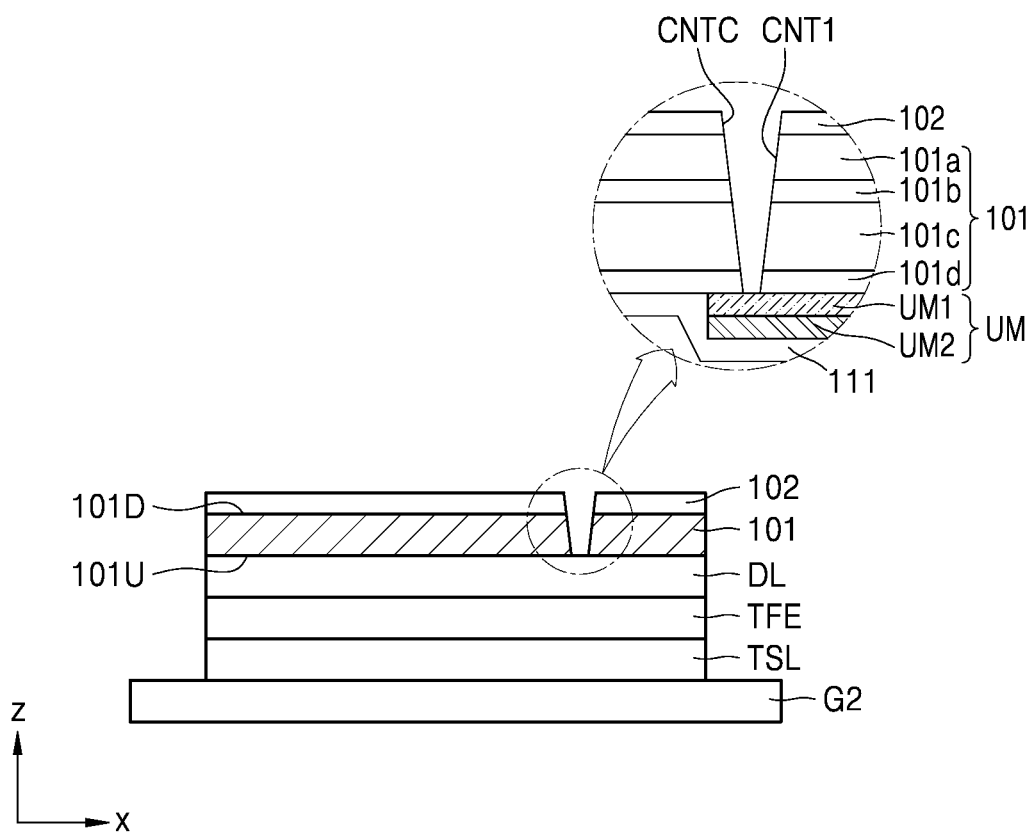
FIGS. 14A and 14B are schematic cross-sectional views for illustrating a method of manufacturing a display device according to another embodiment.
Figure 14B:
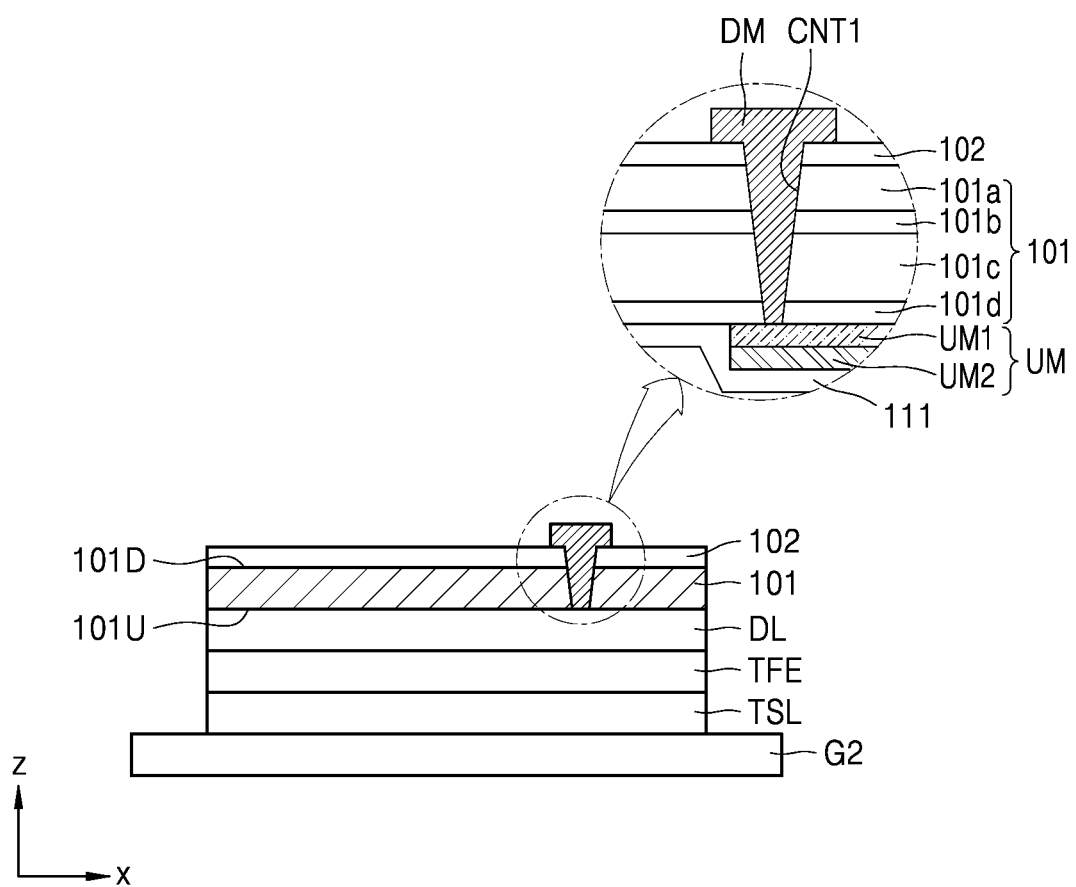

FIGS. 14A and 14B are schematic cross-sectional views of a method of manufacturing a display device according to another embodiment. In FIGS. 14A and 14B, since the same reference numerals as those of FIGS. 13E and 13F denote the same elements, repeated description thereof may be omitted.

Referring to FIGS. 14A and 14B, during an operation of forming the display layer DL, the top conductive pattern UM may be formed on a portion in which the first contact hole CNT1 may be formed.

In an embodiment, the top conductive pattern UM may include the first layer UM1 and the second layer UM2 including a metal different from a metal of the first layer UM1.

In an embodiment, the second layer UM2 may include a metal different from a metal of the first layer UM1. For example, the first layer UM1 may include a conductive oxide such as indium tin oxide (ITO), zinc oxide (IZO), zinc oxide (ZnO), indium oxide ($In_2O_3$), indium gallium oxide (IGO), aluminum zinc oxide (AZO).

In an embodiment, since the first layer UM1 includes a conductive oxide resistant to dry etching, the damage of the second layer UM2 may be prevented.

As described above, embodiments may provide a display device including a conductive pattern on a bottom surface of a substrate, and a method of manufacturing the display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
   a substrate including a top surface, a bottom surface, and a first contact hole passing through the top surface and the bottom surface;
   a thin film transistor disposed above the top surface and including a semiconductor layer;
   a display element connected to the thin film transistor;
   a top conductive pattern disposed between the substrate and the thin film transistor and overlapping the semiconductor layer of the thin film transistor;
   a bottom conductive pattern disposed on the bottom surface and connected to the top conductive pattern through the first contact hole;
   a bottom planarization layer disposed on the bottom surface, the bottom planarization layer disposed on the bottom conductive pattern: and
   a bottom buffer layer disposed between the substrate and the bottom conductive pattern, the bottom buffer layer comprising insulating material.

2. The display device of claim 1, further comprising a buffer layer disposed above the top conductive pattern and including a second contact hole, wherein the semiconductor layer is connected to the top conductive pattern through the second contact hole.

3. The display device of claim 2, wherein the first contact hole is disposed apart from the second contact hole in a second direction intersecting a first direction perpendicular to the top surface.

4. The display device of claim 1, further comprising a connection electrode between the thin film transistor and the display element,
   wherein the thin film transistor is connected to the display element through the connection electrode.

5. The display device of claim 1, wherein the substrate includes:
   base layers including a polymer resin; and
   barrier layers including an inorganic material,
   wherein the base layers and the barrier layers are alternately stacked.

6. The display device of claim 1, wherein the semiconductor layer includes a step difference.

7. The display device of claim 1, wherein
   the thin film transistor includes a gate electrode disposed above the semiconductor layer,
   and
   the gate electrode is connected to a first bottom electrode through a third contact hole in the substrate, the first bottom electrode being disposed between the substrate and the bottom planarization layer.

8. The display device of claim 7, further comprising:
   a bottom insulating layer under the bottom planarization layer; and
   a second bottom electrode between the bottom planarization layer and the bottom insulating layer, the second bottom electrode corresponding to the first bottom electrode.

9. The display device of claim 1, wherein the top conductive pattern includes:
   a first layer including a metal; and
   a second layer including a metal different from the metal of the first layer.

10. The display device of claim 9, wherein the first layer and a pixel electrode of the display element include a same metal.

11. The display device of claim 1, wherein
the thin film transistor includes a source electrode and a drain electrode each connected to the semiconductor layer disposed on the top surface, and
at least one of the source electrode and the drain electrode is connected to the top conductive pattern through a fourth contact hole.

12. A display device comprising:
a substrate including a top surface, a bottom surface, and a first contact hole passing through the top surface and the bottom surface;
a thin film transistor including a semiconductor layer, a source electrode, and a drain electrode each disposed above the top surface;
a display element connected to the thin film transistor and disposed above the top surface;
a bottom conductive pattern disposed on the bottom surface and connected to at least one of the source electrode and the drain electrode through the first contact hole; and
a bottom planarization layer disposed on the bottom conductive pattern,
wherein the substrate includes:
base layers including a polymer resin; and
barrier layers including an inorganic material.

13. The display device of claim 12, further comprising a conductive pattern corresponding to the first contact hole and contacting at least one of the source electrode and the drain electrode,
wherein the bottom conductive pattern is connected to the conductive pattern through the first contact hole.

14. A method of manufacturing a display device, the method comprising:
forming a display layer on a top surface of a substrate disposed on a first carrier substrate, the display layer including a display element;
detaching the first carrier substrate from a bottom surface of the substrate;
attaching a second carrier substrate such that the second carrier substrate faces the top surface of the substrate;
forming a first contact hole in the substrate; and
forming a bottom conductive pattern on the bottom surface, the bottom conductive pattern corresponding to the first contact hole,
wherein the substrate includes:
base layers including a polymer resin; and
barrier layers including an inorganic material.

15. The method of claim 14, wherein the forming of the display layer includes:
forming a top conductive pattern corresponding to a portion of the substrate in which the first contact hole is formed,
wherein the method includes connecting the bottom conductive pattern to the top conductive pattern through the first contact hole.

16. The method of claim 15, wherein the forming of the top conductive pattern includes:
forming a first layer including a metal; and
forming a second layer including a metal different from the metal of the first layer.

17. The method of claim 15, wherein the forming of the display layer includes:
forming a buffer layer on the top conductive pattern; and
forming a thin film transistor including a semiconductor layer disposed on the buffer layer, the semiconductor layer overlapping the top conductive pattern,
wherein the method includes connecting the top conductive pattern to the semiconductor layer through a second contact hole in the buffer layer.

18. The method of claim 14, further comprising, before the forming of the first contact hole, forming a bottom buffer layer on the bottom surface of the substrate.

19. The method of claim 14, further comprising forming a bottom planarization layer disposed on the bottom conductive pattern.

* * * * *